United States Patent
Wang et al.

(10) Patent No.: US 11,462,423 B2
(45) Date of Patent: Oct. 4, 2022

(54) METHOD AND APPARATUS FOR CLEANING SEMICONDUCTOR WAFER

(71) Applicant: ACM Research (Shanghai) Inc., Shanghai (CN)

(72) Inventors: Hui Wang, Shanghai (CN); Fuping Chen, Shanghai (CN); Liangzhi Xie, Shanghai (CN); Shena Jia, Shanghai (CN); Xi Wang, Shanghai (CN); Xiaoyan Zhang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 643 days.

(21) Appl. No.: 16/377,894

(22) Filed: Apr. 8, 2019

(65) Prior Publication Data
US 2019/0273003 A1 Sep. 5, 2019

Related U.S. Application Data

(62) Division of application No. 14/647,996, filed as application No. PCT/CN2012/085403 on Nov. 28, 2012, now Pat. No. 10,297,472.

(51) Int. Cl.
*H01L 21/67* (2006.01)
*H01L 21/677* (2006.01)

(52) U.S. Cl.
CPC .. *H01L 21/67051* (2013.01); *H01L 21/67057* (2013.01); *H01L 21/67781* (2013.01)

(58) Field of Classification Search
CPC ......... H01L 21/67781; H01L 21/67051; H01L 21/67057; H01L 21/67017; H01L 21/67028

(Continued)

(56) References Cited

U.S. PATENT DOCUMENTS

| 4,493,606 A | 1/1985 | Foulke et al. |
| 4,936,328 A | 6/1990 | Yatabe |

(Continued)

FOREIGN PATENT DOCUMENTS

| CN | 1929085 A | 3/2007 |
| CN | 201375944 Y | 1/2010 |

(Continued)

OTHER PUBLICATIONS

International Search Report issued in PCT/CN2012/085403 dated Sep. 5, 2013 (2 pages).

(Continued)

*Primary Examiner* — David G Cormier
*Assistant Examiner* — Thomas Bucci
(74) *Attorney, Agent, or Firm* — Osha Bergman Watanabe & Burton LLP

(57) ABSTRACT

A method and apparatus for cleaning semiconductor wafer, combining batch cleaning and single wafer cleaning together. The method includes: taking at least two wafers from a cassette in a load port and putting said wafers into a first tank filled with chemical solution; after processing said wafers in the first tank, taking said wafers out of the first tank and keeping said wafers wet; putting said wafers into a second tank filled with liquid; after processing said wafers in the second tank, taking said wafers out of the second tank and keeping said wafers wet; putting one of said wafers on a chuck inside a single wafer cleaning module; rotating the chuck while applying chemical solution on said wafer; applying deionized water on said wafer; drying said wafer; taking said wafer out of the single wafer cleaning module and putting said wafer back to the cassette in the load port.

14 Claims, 26 Drawing Sheets

(58) Field of Classification Search
USPC ....................................................... 134/25.1
See application file for complete search history.

(56) References Cited

U.S. PATENT DOCUMENTS

| | | | |
|---|---|---|---|
| RE33,341 E | 9/1990 | Lee et al. | |
| 5,240,557 A | 8/1993 | Dyer et al. | |
| 5,269,643 A | 12/1993 | Kodama et al. | |
| 5,327,921 A * | 7/1994 | Mokuo | H01L 21/67057 134/182 |
| 5,374,153 A | 12/1994 | Nishi | |
| 5,406,092 A * | 4/1995 | Mokuo | H01L 21/67057 414/936 |
| 5,482,068 A * | 1/1996 | Kitahara | H01L 21/67057 134/182 |
| 5,503,171 A * | 4/1996 | Yokomizo | H01L 21/67057 134/182 |
| 5,505,577 A | 4/1996 | Nishi | |
| 5,544,421 A | 8/1996 | Thompson et al. | |
| 5,566,076 A * | 10/1996 | Kuroda | H01L 21/67057 700/213 |
| 5,595,412 A | 1/1997 | Kudo et al. | |
| 5,603,777 A | 2/1997 | Ohashi | |
| 5,664,337 A | 9/1997 | Davis et al. | |
| 5,730,162 A | 3/1998 | Shindo et al. | |
| 5,762,084 A | 6/1998 | Krusell et al. | |
| 5,836,736 A | 11/1998 | Thompson et al. | |
| 5,853,496 A * | 12/1998 | Honda | H01L 21/67057 134/76 |
| 5,862,823 A * | 1/1999 | Kamikawa | H01L 21/67057 134/182 |
| 5,887,602 A * | 3/1999 | Iwama | B08B 3/00 134/68 |
| 6,021,791 A | 2/2000 | Dryer et al. | |
| 6,050,275 A * | 4/2000 | Kamikawa | H01L 21/67057 134/102.3 |
| 6,074,515 A * | 6/2000 | Iseki | H01L 21/67781 414/744.1 |
| 6,091,498 A | 7/2000 | Hanson et al. | |
| 6,138,695 A * | 10/2000 | Shibao | H01L 21/67326 134/147 |
| 6,279,724 B1 | 8/2001 | Davis | |
| 6,345,947 B1 | 2/2002 | Egashira | |
| 6,532,975 B1 * | 3/2003 | Kamikawa | H01L 21/67051 134/140 |
| 6,575,178 B1 | 6/2003 | Kamikawa | |
| 6,637,446 B2 | 10/2003 | Frost et al. | |
| 6,672,820 B1 | 1/2004 | Hanson et al. | |
| 6,942,738 B1 | 9/2005 | Nelson et al. | |
| 7,357,842 B2 | 4/2008 | Ishikawa et al. | |
| 8,002,511 B2 | 8/2011 | Kamikawa et al. | |
| 8,216,391 B2 | 7/2012 | Mokuo | |
| 9,324,602 B2 | 4/2016 | Shinohara et al. | |
| 2001/0043856 A1 * | 11/2001 | Woodruff | H01L 21/67781 414/744.5 |
| 2002/0009357 A1 | 1/2002 | Hanson et al. | |
| 2002/0016067 A1 * | 2/2002 | Yamagata | C11D 7/261 438/689 |
| 2002/0036002 A1 * | 3/2002 | Nakatou | H01L 21/67057 134/61 |
| 2002/0037207 A1 | 3/2002 | Yamasaki et al. | |
| 2002/0081181 A1 | 6/2002 | Yokomori et al. | |
| 2002/0092547 A1 * | 7/2002 | You | H01L 21/67057 134/186 |
| 2002/0100496 A1 * | 8/2002 | Chang | H01L 21/67057 134/76 |
| 2003/0017034 A1 * | 1/2003 | Davis | H01L 21/67173 414/217 |
| 2003/0051972 A1 * | 3/2003 | Davis | H01L 21/67778 198/345.3 |
| 2003/0091410 A1 | 5/2003 | Larson et al. | |
| 2003/0188447 A1 | 10/2003 | Nelson et al. | |
| 2003/0202871 A1 * | 10/2003 | Thompson | H01L 21/67781 414/539 |
| 2003/0230384 A1 | 12/2003 | Su et al. | |
| 2004/0129300 A1 | 7/2004 | Ohshimo et al. | |
| 2004/0211449 A1 * | 10/2004 | Yokomoto | H01L 21/67057 134/61 |
| 2005/0051195 A1 | 3/2005 | Kamikawa | |
| 2005/0072358 A1 * | 4/2005 | Katsuoka | C25D 17/001 118/719 |
| 2006/0099339 A1 * | 5/2006 | Hashizume | H01L 21/67051 118/52 |
| 2006/0177586 A1 * | 8/2006 | Ishida | H01L 21/67184 427/430.1 |
| 2006/0185692 A1 | 8/2006 | Moran et al. | |
| 2007/0221254 A1 * | 9/2007 | Izumi | H01L 21/02041 134/94.1 |
| 2008/0223411 A1 * | 9/2008 | Mokuo | B08B 3/048 134/25.4 |
| 2009/0067959 A1 | 3/2009 | Takahashi et al. | |
| 2009/0097950 A1 * | 4/2009 | Tanaka | H01L 21/67781 414/806 |
| 2010/0068014 A1 * | 3/2010 | Mitsuyoshi | H01L 21/67313 414/226.04 |
| 2011/0000512 A1 * | 1/2011 | Toshima | H01L 21/67057 134/34 |
| 2011/0041764 A1 | 2/2011 | Webb et al. | |
| 2011/0126860 A1 * | 6/2011 | Hyakutake | H01L 21/67057 134/56 R |
| 2011/0135428 A1 | 6/2011 | Kim et al. | |
| 2011/0264260 A1 * | 10/2011 | Hong | H01L 21/67781 901/14 |
| 2012/0234358 A1 * | 9/2012 | Takemura | H01L 21/02052 134/25.1 |
| 2012/0308346 A1 * | 12/2012 | Keigler | H01L 21/68 414/222.09 |
| 2013/0061888 A1 * | 3/2013 | Sato | H01L 21/67248 134/95.2 |

FOREIGN PATENT DOCUMENTS

| | | |
|---|---|---|
| CN | 201956323 U | 8/2011 |
| JP | H07183268 A | 7/1995 |
| JP | H09199461 A | 7/1997 |
| KR | 19990088436 A | 12/1999 |
| KR | 20040070807 A | 8/2004 |
| TW | 200842965 A | 11/2008 |

OTHER PUBLICATIONS

Written Opinion of the International Searching Authority issued in PCT/CN2012/085403 dated Sep. 5, 2013 (4 pages).
Office Action issued in corresponding Chinese Application No. 201280077256.1 dated Nov. 23, 2016, and English translation thereof (17 pages).
Office Action issued in corresponding Korean Application No. 10-2015-7012686 dated Nov. 5, 2018, and English translation thereof (12 pages).

* cited by examiner

METHOD AND APPARATUS FOR CLEANING SEMICONDUCTOR WAFER

BACKGROUND OF THE INVENTION

1. Field of the Invention

The present invention generally relates to the field of fabricating integrated circuits, and more particularly relates to a method and apparatus for cleaning semiconductor wafers.

2. The Related Art

During the integrated circuit fabrication process, a wet cleaning process is essential for obtaining high quality integrated circuits. After a dry etching process, a wafer needs to be cleaned to remove residual photoresist, organics produced during the dry etching process, and film material attached on a surface of the wafer. The main chemical solution for cleaning the wafer includes, for example SC1, BOE and SPM which is a mixture of $H_2SO_4$ and $H_2O_2$. Thereinto, the temperature of SPM is higher than 90° C. and the SPM is used for removing the residual photoresist and organics. Generally, there are two ways to clean the wafer in the industry. One is batch cleaning and the other is single wafer cleaning, both of which will be comparatively described.

The batch cleaning is capable of cleaning a plurality of wafers every time. An apparatus for batch cleaning includes mechanical transmission devices and several cleaning tanks. A plurality of wafers can be cleaned in one of the cleaning tanks simultaneously, so the efficiency of batch cleaning is high and about four hundred wafers can be cleaned per hour. Moreover, because the chemical solution in the cleaning tanks is circulated, therefore, the chemical solution can be reused and the cost of batch cleaning is reduced, especially for high temperature chemical solution, like 120° C. SPM, for the high temperature SPM is expensive, so the cleaning cost can be reduced by using the batch cleaning. However, with the line width of integrated circuit shrinking continuously, the disadvantages of the batch cleaning are exposed visibly. During the batch cleaning process, the wafers are put in the cleaning tanks vertically, which easily causes cross contamination. Specially, if one of the wafers in one of the cleaning tanks has metal or organic contaminants, all the wafers cleaned in the same cleaning tank are contaminated. After cleaned, the wafers are taken out of the cleaning tanks vertically. At this time, if the chemical solution in the cleaning tanks has some tiny organic contaminants, the tiny organic contaminants will adhere to the surfaces of the wafers along with the chemical solution. Once the wafers are dried, the tiny organic contaminants on the wafers are very hard to remove.

The single wafer cleaning can only clean a piece of wafer every time. An apparatus of single wafer cleaning includes mechanical transmission devices and several independent single wafer cleaning modules. The cleaning and drying processes of one wafer are finished in one single wafer cleaning module. After cleaning a piece of wafer, the chemical solution in the single wafer cleaning module is drained and new chemical solution is supplied to the single wafer cleaning module to clean another piece of wafer, avoiding cross contaminant. The single wafer cleaning can effectively remove particles and film material, but the single wafer cleaning has a limitation in use of high temperature chemical solution, such as SPM which temperature is higher than 90° C., because the high temperature chemical solution is hard to recycle.

Both the batch cleaning and the single wafer cleaning have their own advantages and disadvantages. Only adopting the batch cleaning or the single wafer cleaning cannot achieve the best cleaning effect and also cannot meet the needs of modern process. Therefore, inventing a new method and apparatus which combine the advantages of the batch cleaning and the single wafer cleaning will be a great contribution to the integrated circuit fabrication process.

SUMMARY OF THE INVENTION

Accordingly, an object of the present invention is to provide a method for cleaning semiconductor wafer. The method includes the following steps: taking at least two wafers from a cassette in a load port and putting said wafers into a first tank filled with chemical solution; after said wafers have been processed in the first tank, taking said wafers out of the first tank and keeping said wafers in wet status; putting said wafers into a second tank filled with liquid; after said wafers have been processed in the second tank, taking said wafers out of the second tank and keeping said wafers in wet status; putting one of said wafers on a chuck inside a single wafer cleaning module; rotating the chuck while applying chemical solution on said wafer; applying deionized water on said wafer; drying said wafer; taking said wafer out of the single wafer cleaning module and then putting said wafer back to the cassette in the load port.

Accordingly, another object of the present invention is to provide an apparatus for cleaning semiconductor wafer. In one embodiment, the apparatus includes a first cassette, at least one first tank, a second tank, at least two single wafer cleaning modules, two turnover mechanisms, a first robot, a second robot and a third robot. The first cassette is located in a load port for loading a plurality of wafers. The first tank is filled with chemical solution. The second tank is filled with liquid. The single wafer cleaning modules are used for cleaning and drying single wafer. The two turnover mechanisms are used for turning the wafers put therein. One turnover mechanism is disposed adjacent to the first tank and the other turnover mechanism is disposed adjacent to the second tank. The first robot is equipped with at least two wafer loading arms for taking at least two wafers from the first cassette and putting the at least two wafers in the turnover mechanism adjacent to the first tank. The second robot is used for taking the at least two wafers from the turnover mechanism and putting the at least two wafers into the first tank and the second tank successively. After the at least two wafers are immersed into the first tank and the second tank respectively for a period of time, the second robot takes the at least two wafers out of the second tank and puts the at least two wafers in the turnover mechanism adjacent to the second tank. The third robot is equipped with at least two wafer loading arms for taking the at least two wafers out of the turnover mechanism adjacent to the second tank and putting one of the at least two wafers into one of the single wafer cleaning modules for performing single wafer cleaning and drying processes, wherein the at least two wafers are kept in wet status all the time before single wafer cleaning and drying processes are performed. Finally, the first robot takes the wafer out of the single wafer cleaning module and puts the wafer back to the first cassette.

According to another embodiment, an apparatus for cleaning semiconductor wafer includes a first cassette, at least one first tank, a second tank, at least two single wafer cleaning modules, two turnover mechanisms, a buffer area, a first robot, a second robot and a third robot. The first cassette is located in a load port for loading a plurality of wafers. The first tank is filled with chemical solution. The second tank is filled with liquid. The single wafer cleaning modules are used for cleaning and drying single wafer. The two turnover mechanisms are used for turning the wafers put therein. One turnover mechanism is disposed adjacent to the first tank and the other turnover mechanism is disposed adjacent to the second tank. The buffer area is used for temporarily receiving the wafers. The first robot is equipped with at least two wafer loading arms for taking at least two wafers from the first cassette and putting the at least two wafers into the buffer area. The third robot is equipped with at least two wafer loading arms for taking the at least two wafers out of the buffer area and putting the at least two wafers in the turnover mechanism adjacent to the first tank. The second robot is used for taking the at least two wafers from the turnover mechanism and putting the at least two wafers into the first tank and the second tank successively. After the at least two wafers are immersed into the first tank and the second tank respectively for a period of time, the second robot takes the at least two wafers out of the second tank and puts the at least two wafers in the turnover mechanism adjacent to the second tank. Then the third robot takes the at least two wafers out of the turnover mechanism adjacent to the second tank and puts one of the at least two wafers into one of the single wafer cleaning modules for performing single wafer cleaning and drying processes, wherein the at least two wafers are kept in wet status all the time before single wafer cleaning and drying processes are performed. Finally, the first robot takes the wafer out of the single wafer cleaning module and puts the wafer back to the first cassette.

According to another embodiment, an apparatus for cleaning semiconductor wafer includes a first cassette, at least one first tank, a second tank, at least two single wafer cleaning modules, two turnover mechanisms, a first robot and a second robot. The first cassette is located in a load port for loading a plurality of wafers. The first tank is filled with chemical solution. The second tank is filled with liquid. The single wafer cleaning modules are used for cleaning and drying single wafer. The two turnover mechanisms are used for turning the wafers put therein. One turnover mechanism is disposed adjacent to the first tank and the other turnover mechanism is disposed adjacent to the second tank. The first robot is equipped with at least three wafer loading arms, one of which takes at least two wafers from the first cassette and puts the at least two wafers in the turnover mechanism adjacent to the first tank. The second robot is used for taking the at least two wafers from the turnover mechanism and putting the at least two wafers into the first tank and the second tank successively. After the at least two wafers are immersed into the first tank and the second tank respectively for a period of time, the second robot takes the at least two wafers out of the second tank and puts the at least two wafers in the turnover mechanism adjacent to the second tank. Then one of the wafer loading arms of the first robot takes the at least two wafers out of the turnover mechanism adjacent to the second tank and puts one of the at least two wafers into one of the single wafer cleaning modules for performing single wafer cleaning and drying processes, wherein the at least two wafers are kept in wet status all the time before single wafer cleaning and drying processes are performed. Finally one of the wafer loading arms of the first robot takes the wafer out of the single wafer cleaning module and puts the wafer back to the first cassette.

As described above, the present invention combines the batch cleaning and the single wafer cleaning together, developing the advantages of the batch cleaning and the single wafer cleaning. Adopting the method and apparatus of the present invention can effectively remove organics, particles and film material after the wafers undergo a dry etching process. The high temperature process can be performed by the batch cleaning to remove the organics since the high temperature chemical solution can be recycled and reused in the batch cleaning process and, acid mist produced during the batch cleaning process can be controlled well. The particles and film material are removed by the single wafer cleaning. Because the wafers are kept in wet status all the time before single wafer cleaning and drying processes are performed, contaminants on the wafers are easily removed by single wafer cleaning.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
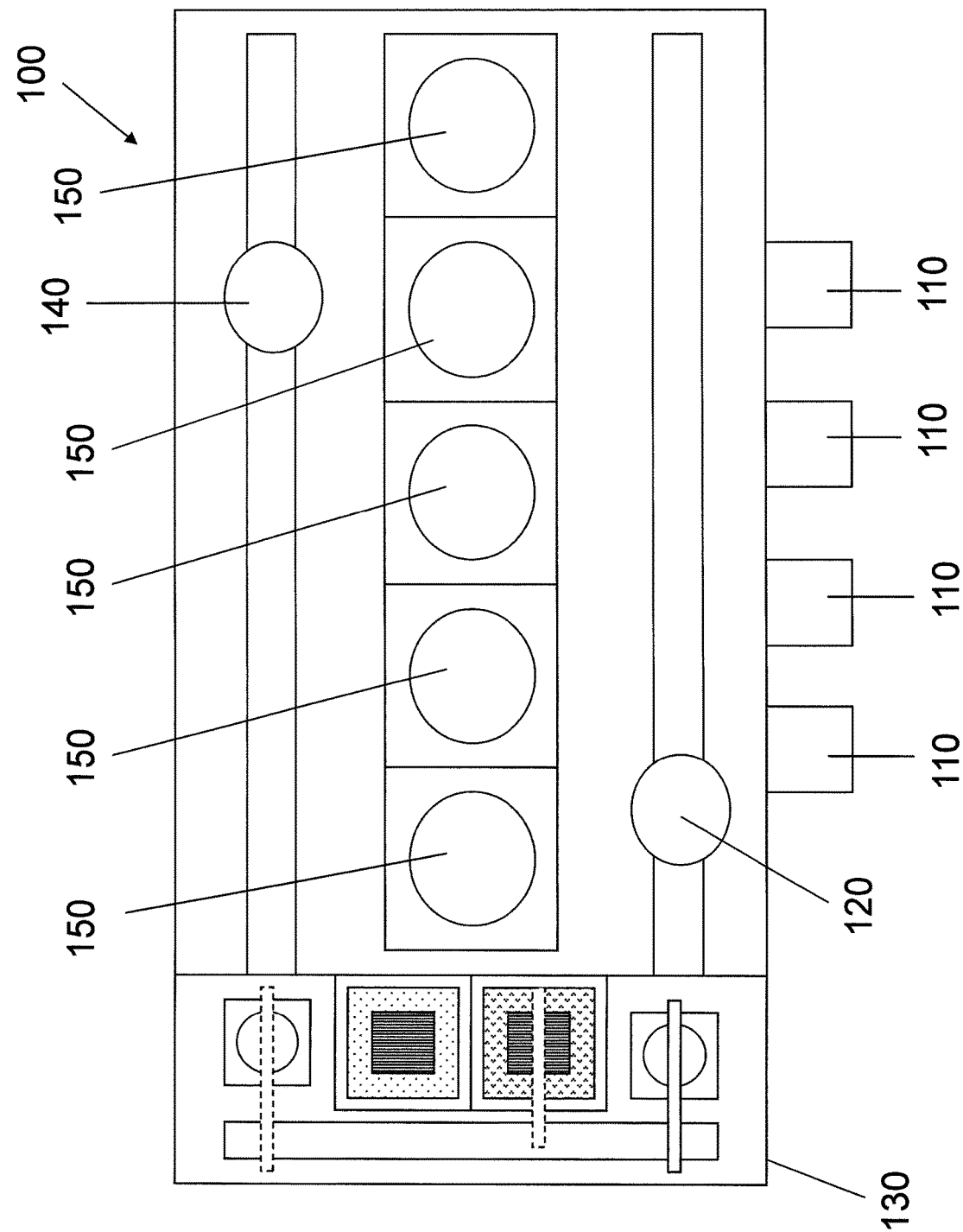
FIG. 1 is a schematic view showing an exemplary apparatus for cleaning semiconductor wafer according to the present invention.

Referring to FIG. 1, an apparatus 100 for cleaning semiconductor wafer according to the present invention includes several load ports 110, a first robot 120, a batch cleaning device 130, a third robot 140 and several single wafer cleaning modules 150, all of which will be described in detail hereinafter.

Every load port 110 can be used for receiving a first cassette (not shown). A plurality of wafers are loaded in the first cassette. Generally, there are twenty five pieces of wafers loaded in the first cassette. In order to raise the cleaning efficiency of the apparatus 100, the apparatus 100 can include more than one load port 110. In the preferred embodiment, there are four load ports 110 arranged side by side. It should be recognized that the number of load port 110 is not limited in four.

The first robot 120 is equipped with at least two wafer loading arms. One of the wafer loading arms can be used for taking the plurality of wafers out of the first cassette located in the load port 110 and putting the plurality of wafers in a turnover mechanism 131 of the batch cleaning device 130, as shown in FIG. 6(a). The other wafer loading arm can be used for taking the wafer out of the single wafer cleaning module 150 and putting the wafer back to the first cassette. Preferably, the first robot 120 can include five independent wafer loading arms, and every wafer loading arm is equipped with one end effector for taking one wafer out of the single wafer cleaning module 150 and putting the wafer back to the first cassette. The first robot 120 can further include another independent wafer loading arm with five end effectors for taking five wafers out of the first cassette and putting the five wafers in the turnover mechanism 131 every time.

Figure 2:
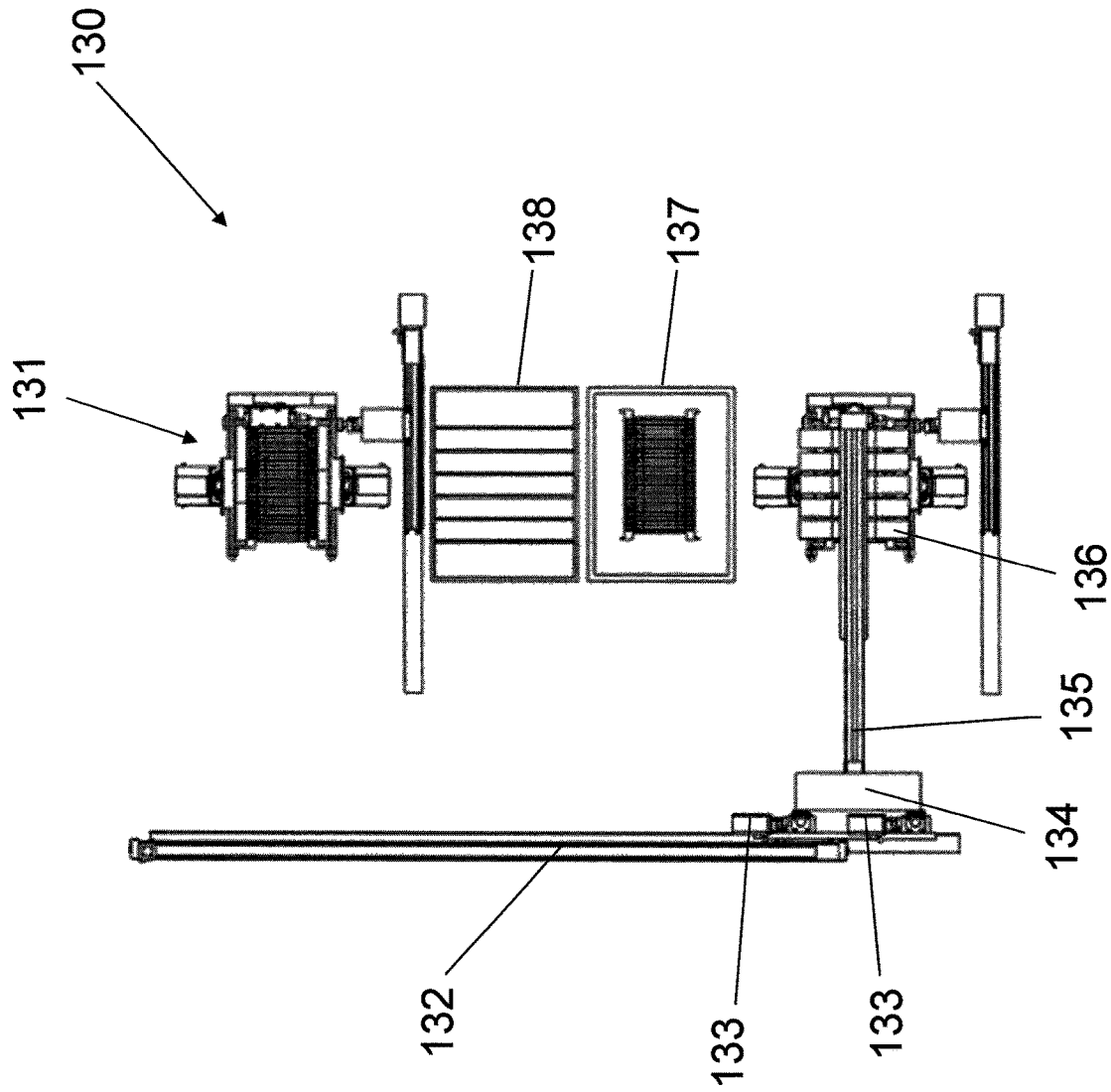
FIG. 2 is a top view showing an exemplary batch cleaning device of the apparatus according to the present invention.
Figure 3:
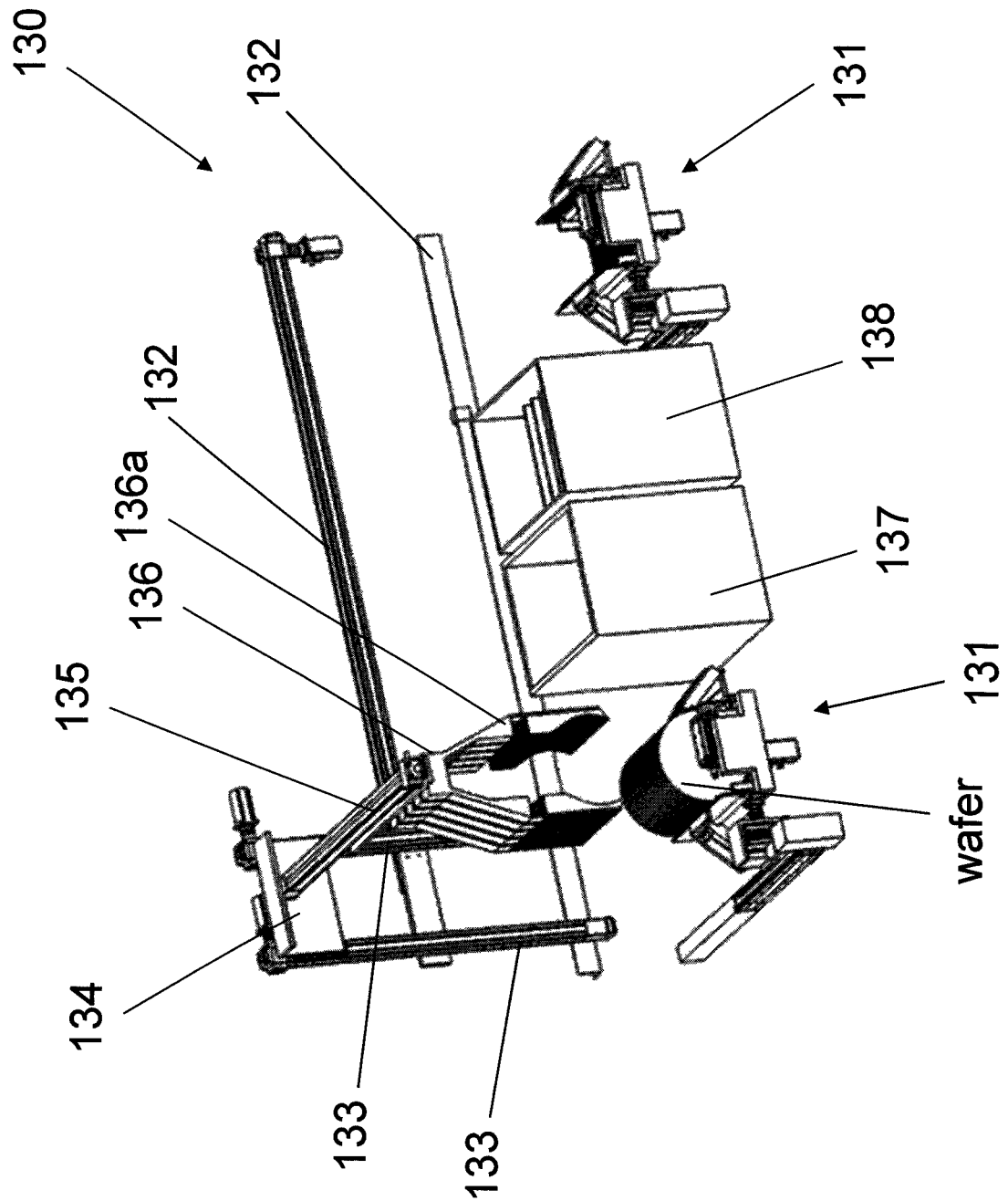
FIG. 3 is a perspective view showing the batch cleaning device.
Figure 4:
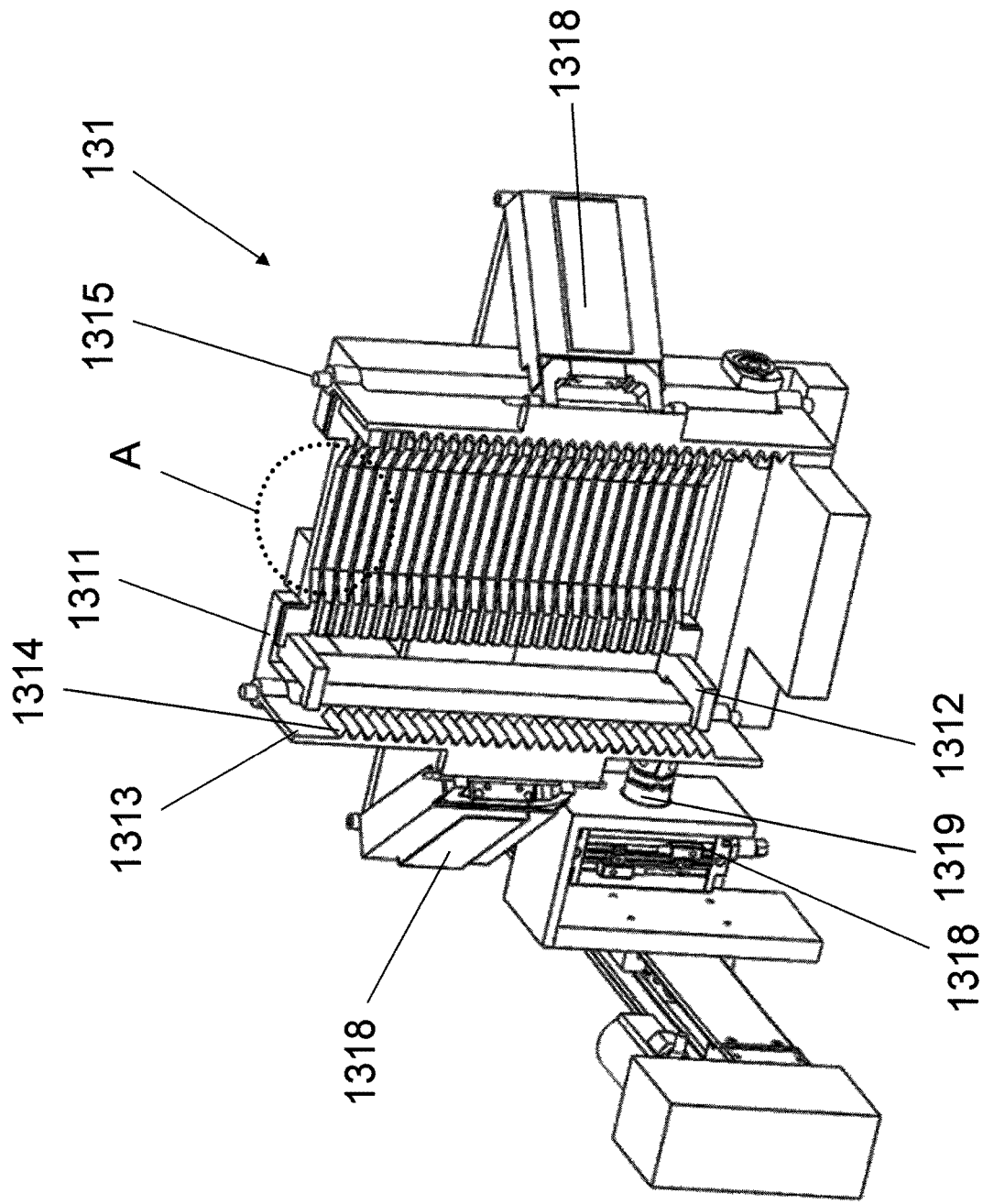
FIG. 4 is a perspective view showing an exemplary turnover mechanism of the batch cleaning device.
Figure 5:
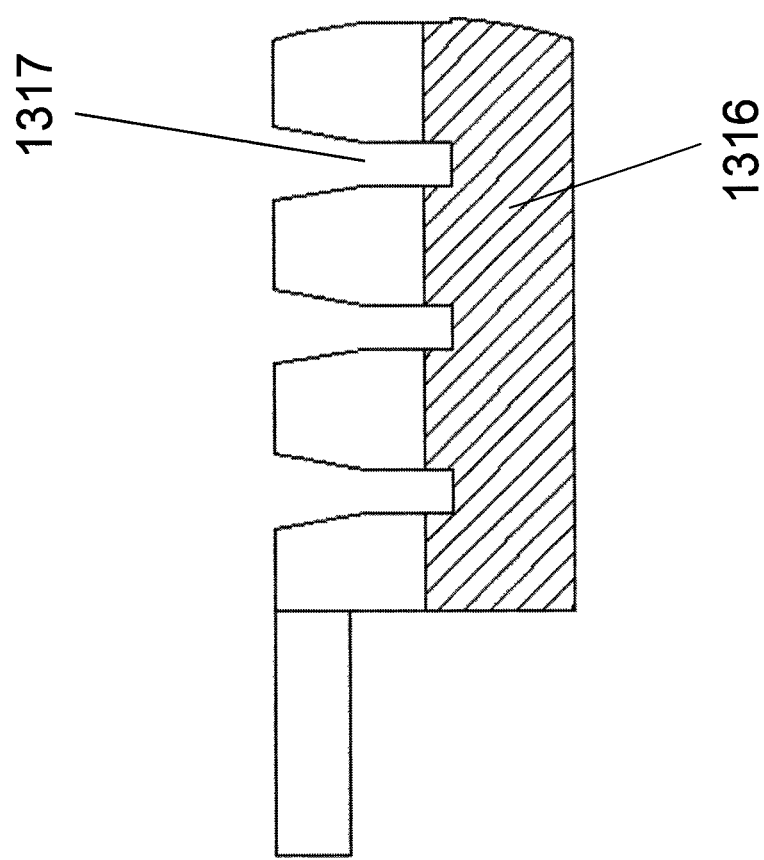
FIG. 5 is an enlarged view of A portion shown in FIG. 4.

With reference to FIG. 2 to FIG. 10(c) illustrating the batch cleaning device 130 used for cleaning a plurality of wafers simultaneously every time, the batch cleaning device 130 can include two turnover mechanisms 131, a wafer transmission device, a first tank 137 and a second tank 138. The two turnover mechanisms 131 are the same as each other as shown in FIG. 4 and FIG. 5. It should be recognized that the two turnover mechanisms 131 can be different. As shown in FIG. 4 and FIG. 5, every turnover mechanism 131 has a pedestal 1311 used for receiving the plurality of wafers. Opposite sides of the pedestal 1311 respectively protrude inwardly to form two pairs of leading pillars 1312. Each of the side of the pedestal 1311 flexibly connects with a side wall 1313 by using a revolving shaft 1315. The side wall 1313 protrudes inwardly to form a stack of supporting portions 1314 for supporting the plurality of wafers correspondingly. There is a space between every two of the adjacent supporting portions 1314 for holding a wafer. A wafer holder 1316 is disposed in the pedestal 1311. The wafer holder 1316 can slide along the leading pillars 1312 by using a driving device. The wafer holder 1316 defines a plurality of grooves 1317 thereon for holding the plurality of wafers. Two cylinders 1318 are provided to connect with the side walls 1313 respectively for driving the side walls 1313 turning around the revolving shafts 1315. So the side walls 1313 can be unfolded or folded. An axle 1319 passes through the pedestal 1311 and can be fixed with the pedestal 1311 by such as screws. A tip end of the axle 1319 which is exposed outside of the pedestal 1311 connects with another cylinder 1318 for driving the pedestal 1311 turning.

As shown in FIG. 2 and FIG. 3, the wafer transmission device can include a pair of horizontal guiding rails 132 and a pair of vertical guiding rails 133. The vertical guiding rails 133 are perpendicular to the horizontal guiding rails 132 and can move along the horizontal guiding rails 132. A supporting plate 134 is disposed on the vertical guiding rails 133 and can move up and down along the vertical guiding rails 133. A supporting arm 135 is fixed on the supporting plate 134 and perpendicular to the supporting plate 134. A second robot 136 is disposed on the supporting arm 135 and faces to the turnover mechanism 131 beside the first tank 137. The second robot 136 can move along the supporting arm 135. The second robot 136 has five pairs of wafer hands. Each pair of wafer hands is independent and can be opened or closed to grip five pieces of wafers every time. The first tank 137 and the second tank 138 are arranged side by side and between the two turnover mechanisms 131. The material of the first tank 137 and the second tank 138 can be, for example, quartz material. It should be recognized that the material which can resist corrosion can be fit for making the first tank 137 and the second tank 138. The first tank 137 is filled with chemical solution for processing the plurality of wafers put therein. The chemical solution in the first tank 137 can include hot SPM at an elevated temperature higher than room 20° C. and lower than 250° C., or solvent which temperature is an elevated temperature higher than room 20° C. and lower than 250° C., such as TMAH. The second tank 138 is filled with liquid for processing the plurality of wafers after the plurality of wafers are processed in the first tank 137. The liquid can be deionized water with an elevated temperature higher than 20° C. and lower than 100° C. It should be recognized that the number of tanks and the kind of chemical solution or liquid in the tanks depend on practical applications.

Figure 8A:
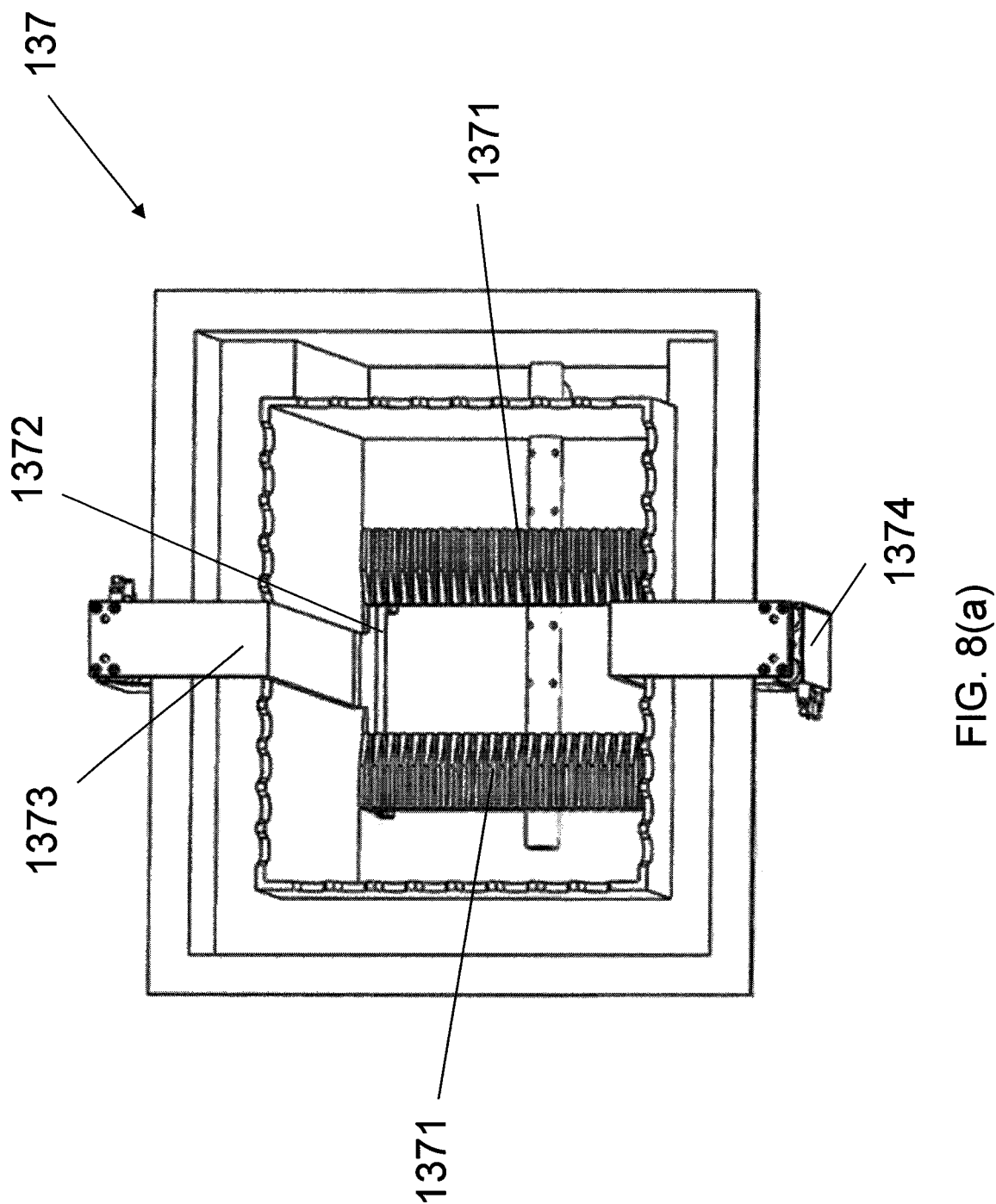
FIG. 8(a) is a perspective view showing an exemplary first tank of the batch cleaning device.
Figure 8B:
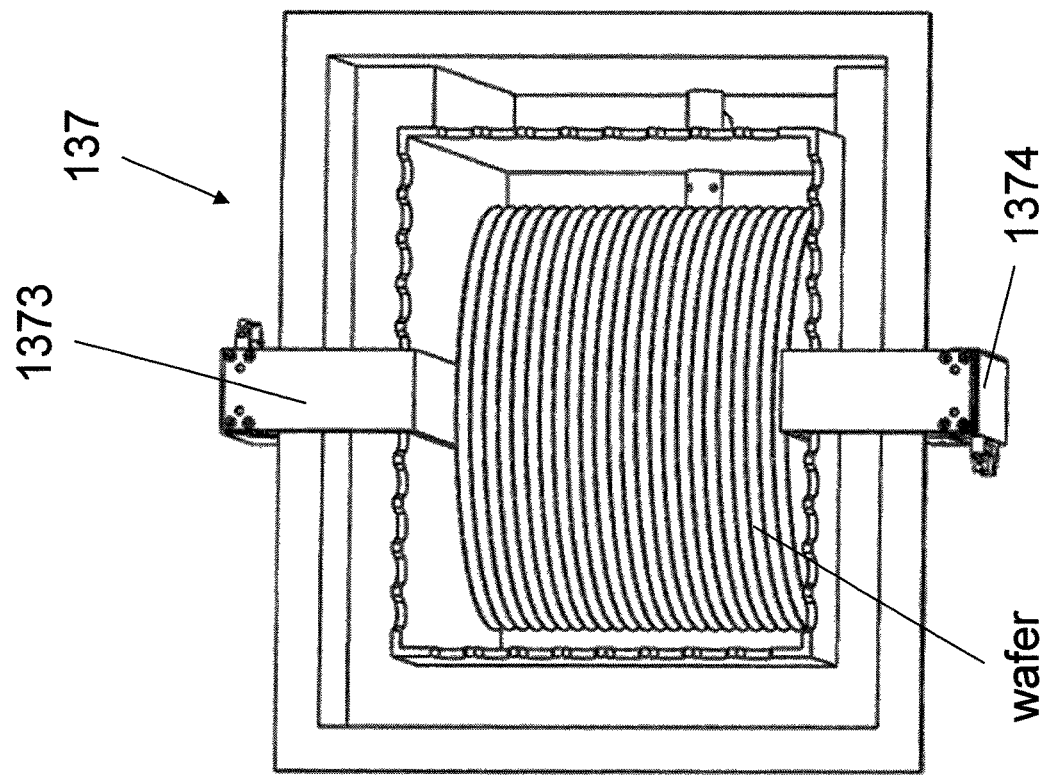
FIG. 8(b) shows twenty five pieces of wafers put in the first tank to be processed by the robot.
Figure 8C:
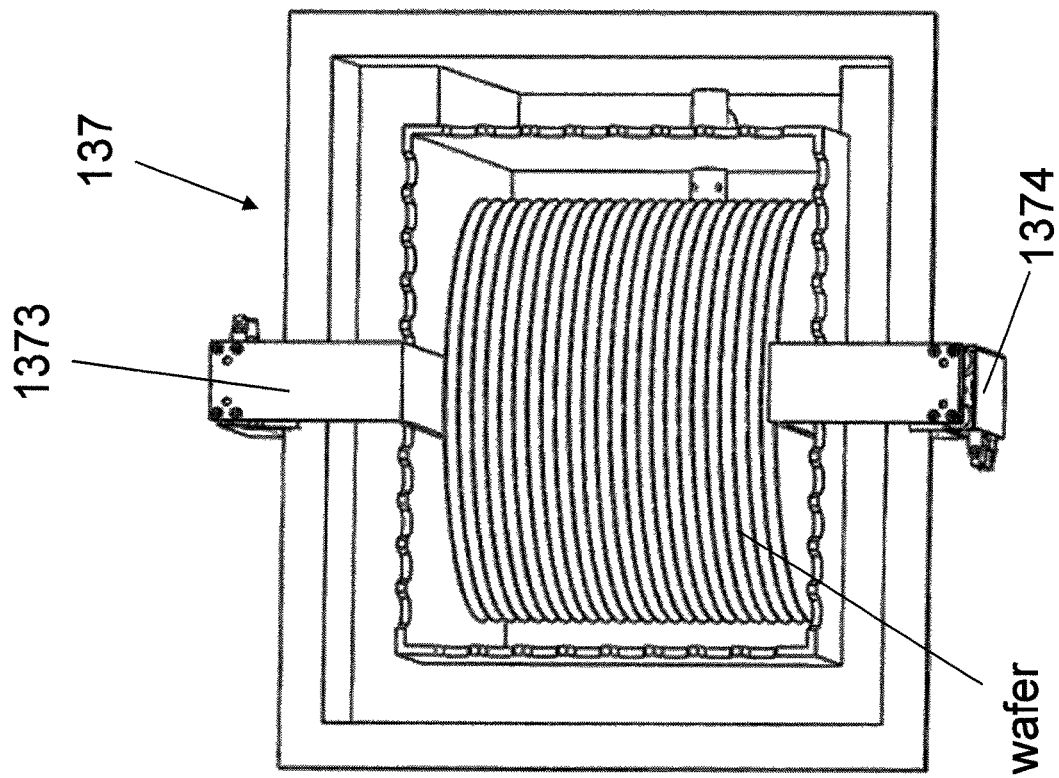
FIG. 8(c) shows the twenty five pieces of wafers being processed in the first tank.

Referring to FIGS. 8(a) to 8(c), the first tank 137 is illustrated in detailed. The first tank 137 has a pair of wafer sustainers 1371 for supporting at most twenty five pieces of wafers. The two wafer sustainers 1371 are connected together by a pair of connecting members 1372 which are disposed at two opposite ends of the wafer sustainers 1371. Two lifting members 1373 are respectively connected to the connecting members 1372 and cylinders 1374. The cylinders 1374 are used for driving the lifting members 1373 to rise or drop, and correspondingly, the wafer sustainers 1371 are lifted or descended along with the lifting members 1373. When the second robot 136 takes twenty five pieces of wafers from the turnover mechanism 131 beside the first tank 137 and puts the wafers in the first tank 137, the cylinders 1374 drive the lifting members 1373 to rise and the wafer sustainers 1371 are lifted out of the chemical solution to receive the wafers, avoiding the second robot 136 contacting the chemical solution in the first tank 137. After the wafers are put on the wafer sustainers 1371, the cylinders 1374 drive the lifting members 1373 to drop and the wafer sustainers 1371 are descended to make the wafers immerse in the chemical solution to be processed.

Figure 9:
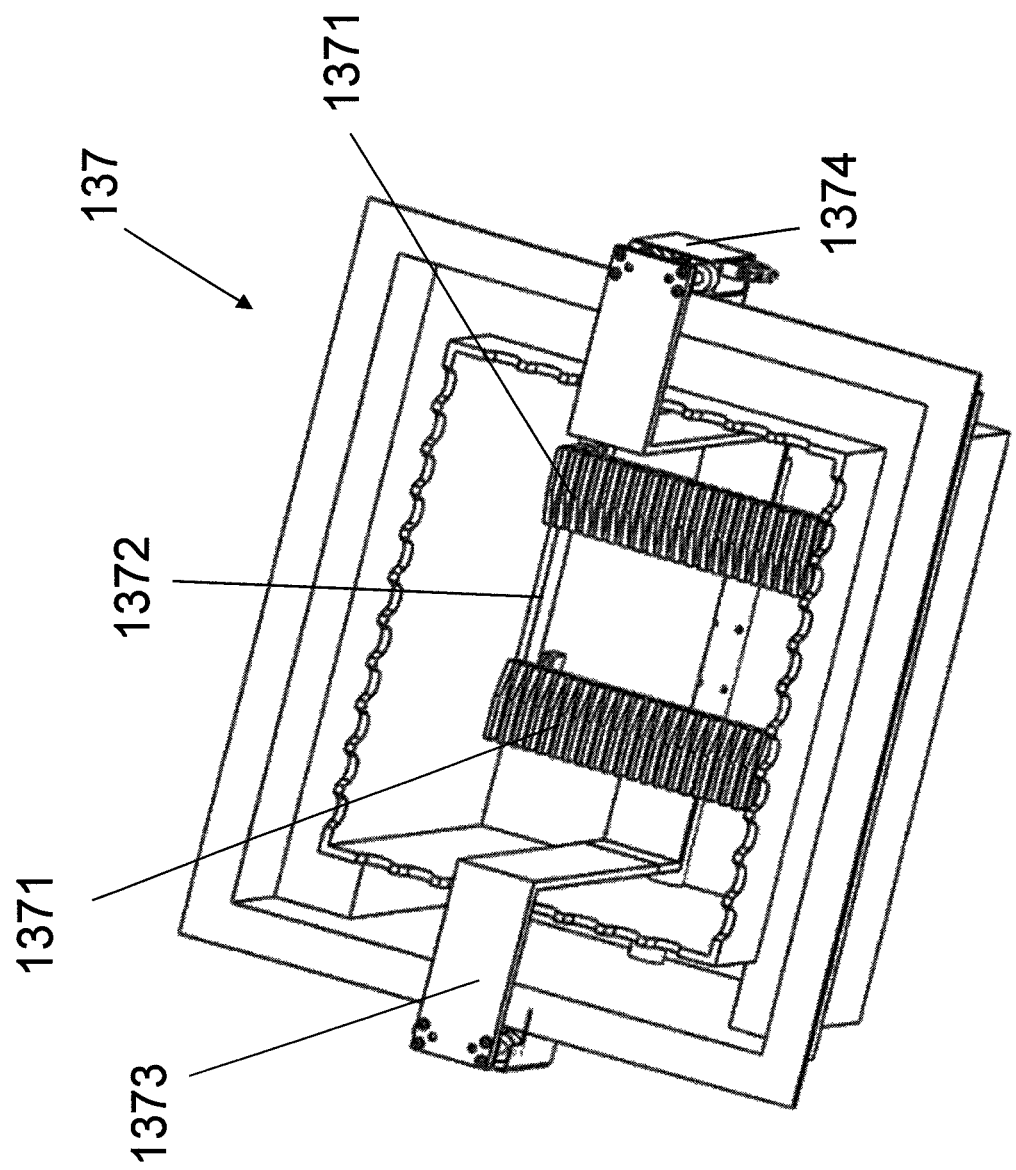
FIG. 9 is a perspective view showing another exemplary first tank of the batch cleaning device.

Referring to FIG. 9 showing another exemplary first tank 137, the difference of the first tank 137 is that the lifting members 1373 are connected to the wafer sustainers 1371 respectively.

Figure 10A:
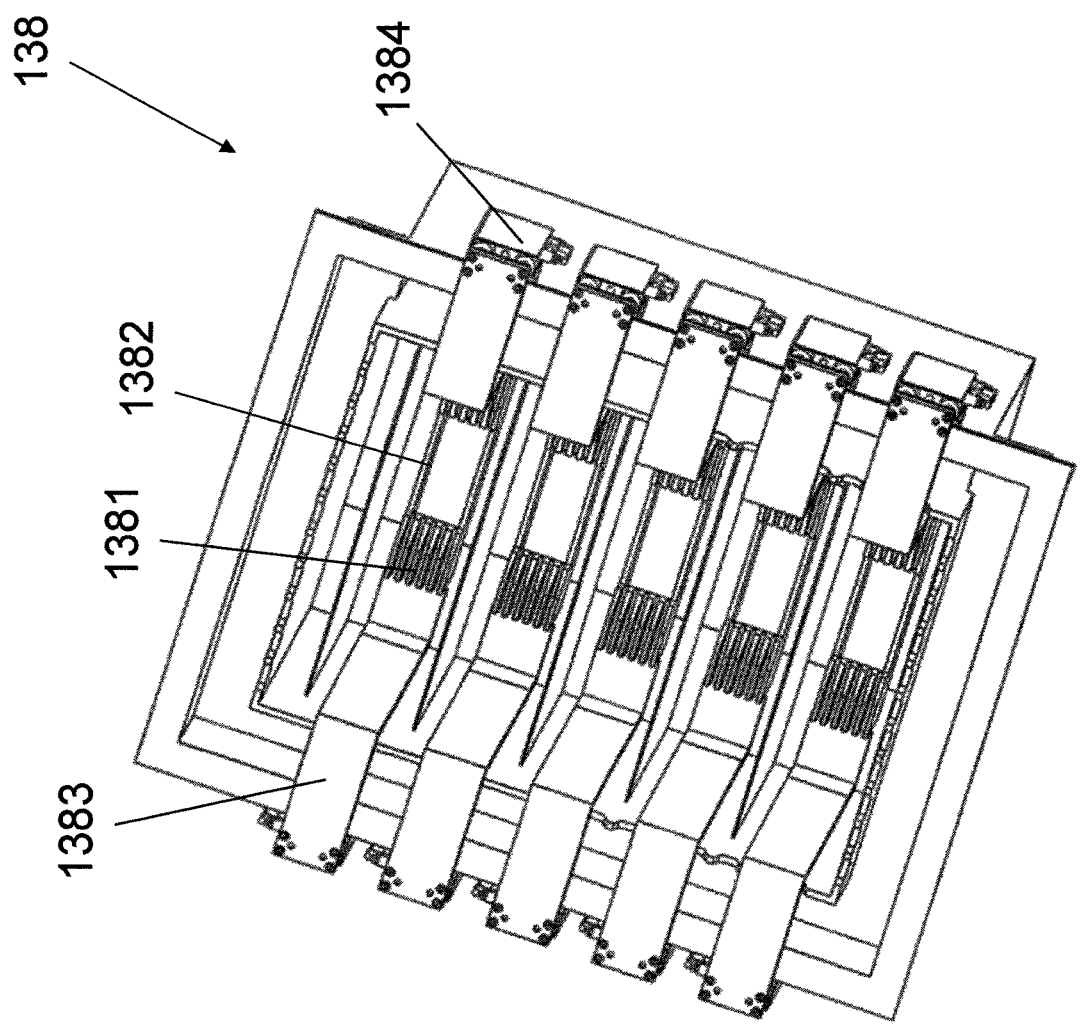
FIG. 10(a) is a perspective view showing an exemplary second tank of the batch cleaning device.
Figure 10B:
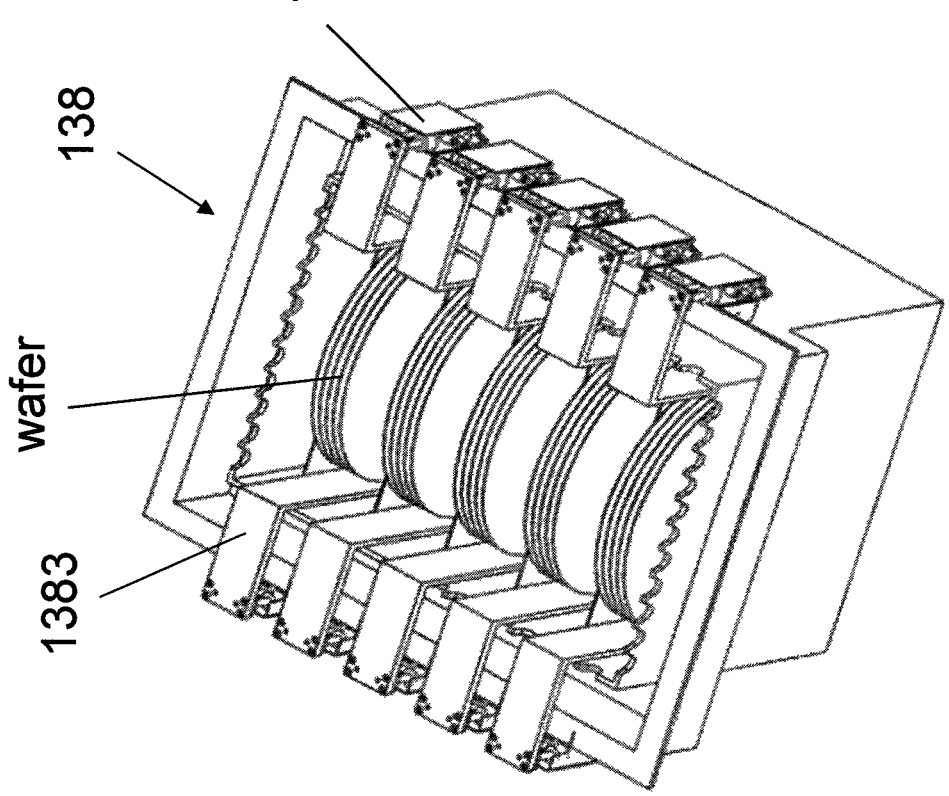
FIG. 10(b) shows twenty five pieces of wafers put in the second tank to be processed by the robot.
Figure 10C:
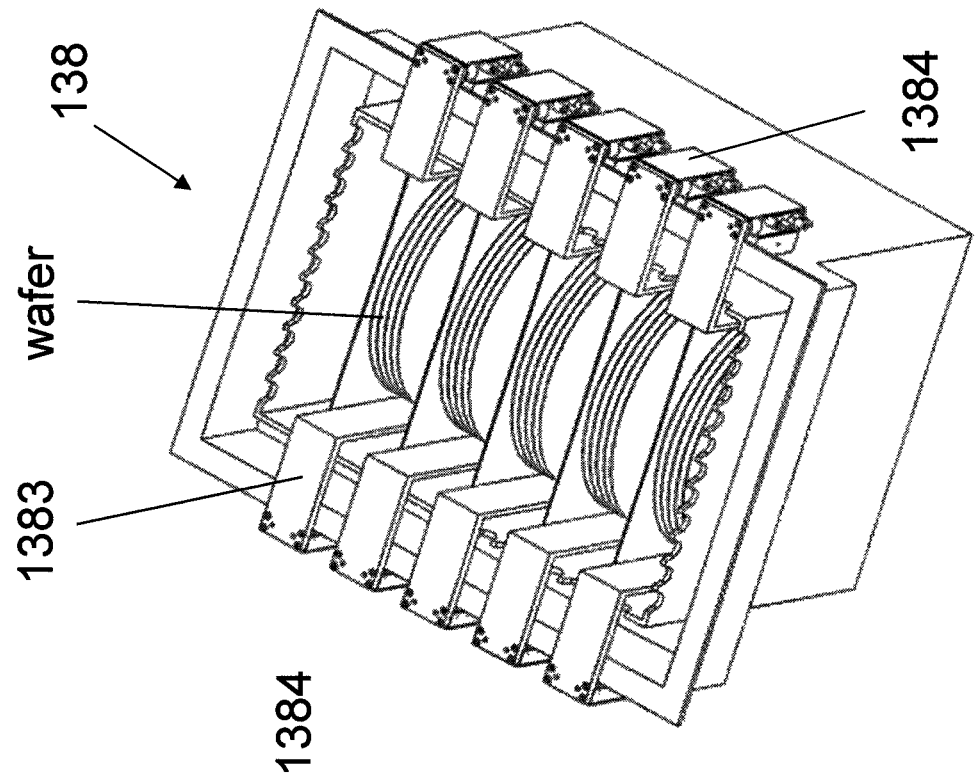
FIG. 10(c) shows the twenty five pieces of wafers being processed in the second tank.
Figure 11:
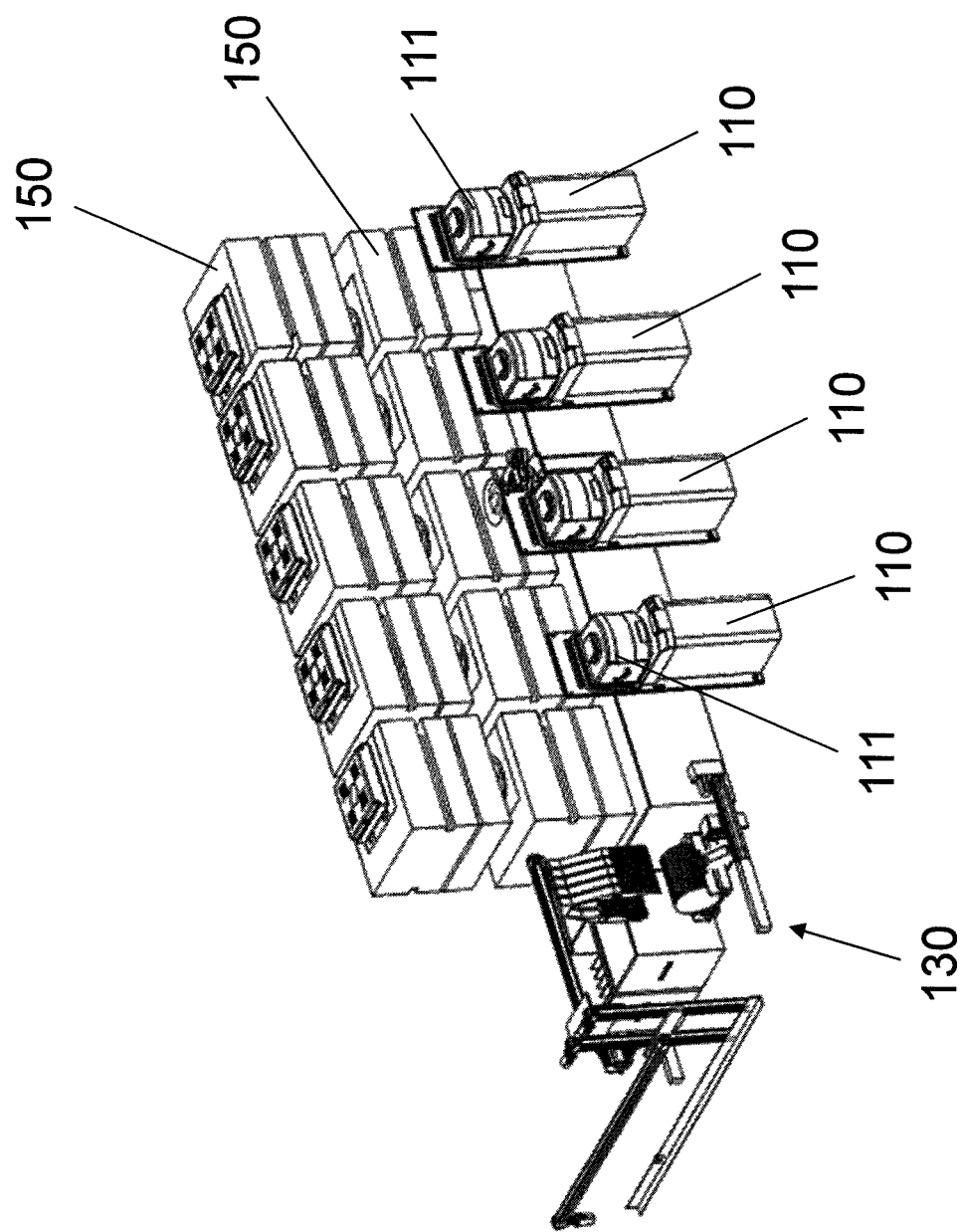
FIG. 11 shows the wafers turned 90° C. by the turnover mechanism for batch cleaning.
Figure 12:
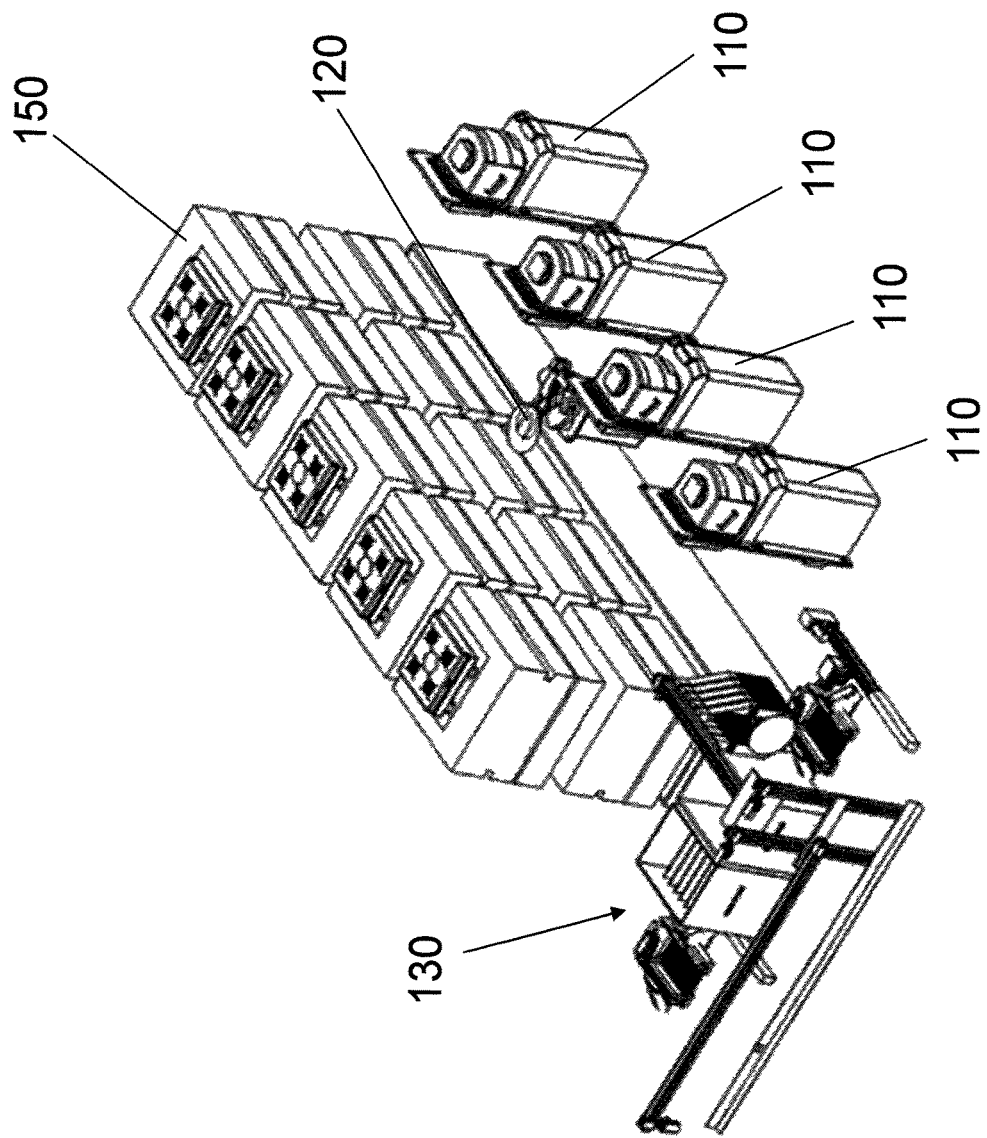
FIG. 12 shows the robot taking the wafers from the turnover mechanism for batch cleaning.
Figure 13:
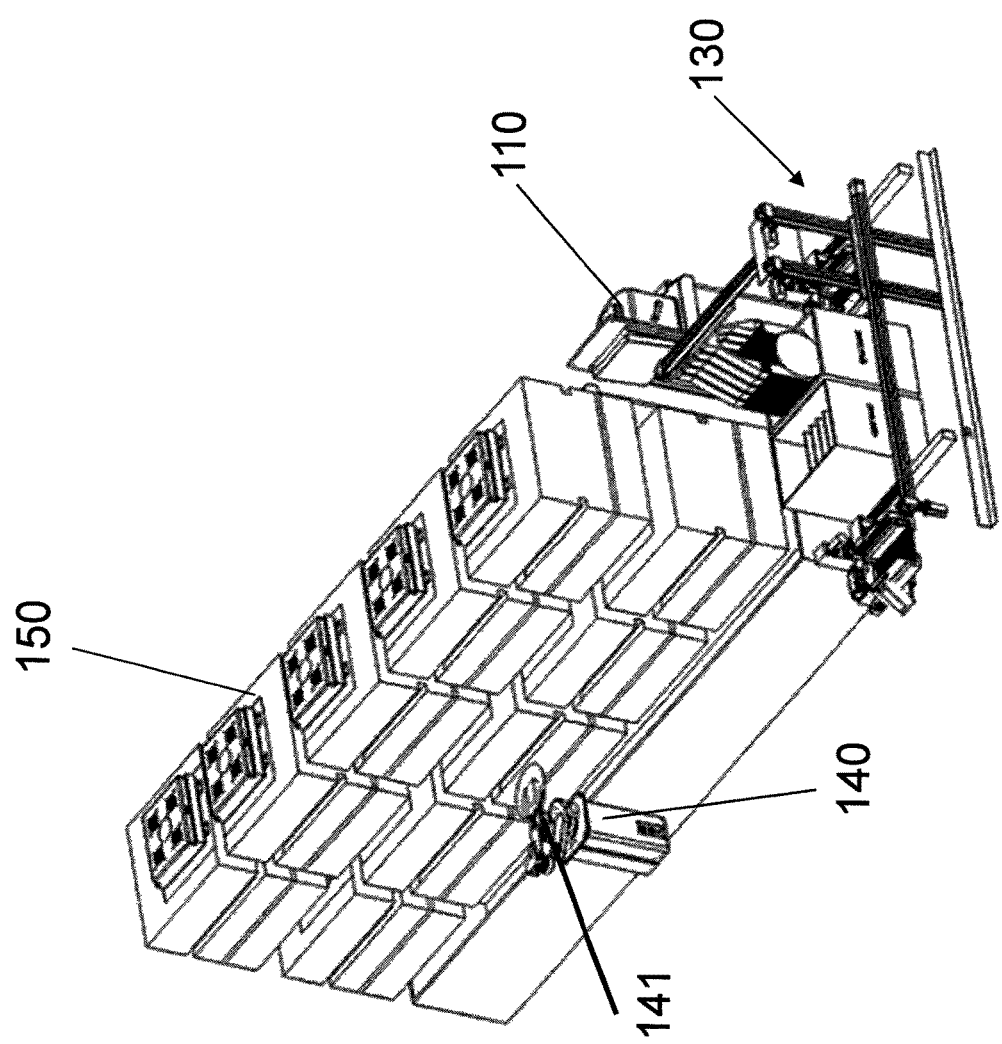
FIG. 13 shows the wafers put in the first tank for cleaning.
Figure 14:
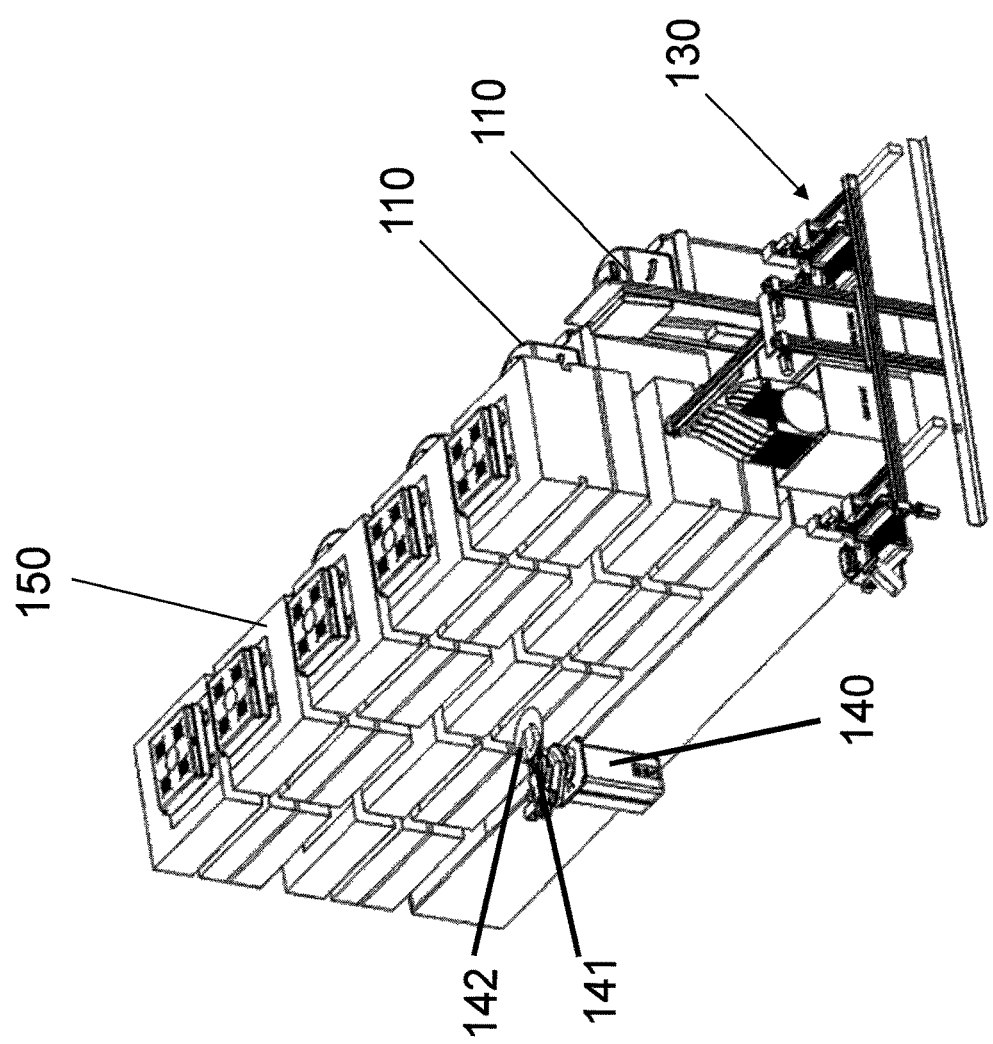
FIG. 14 shows the wafers put in the second tank for cleaning.
Figure 15:
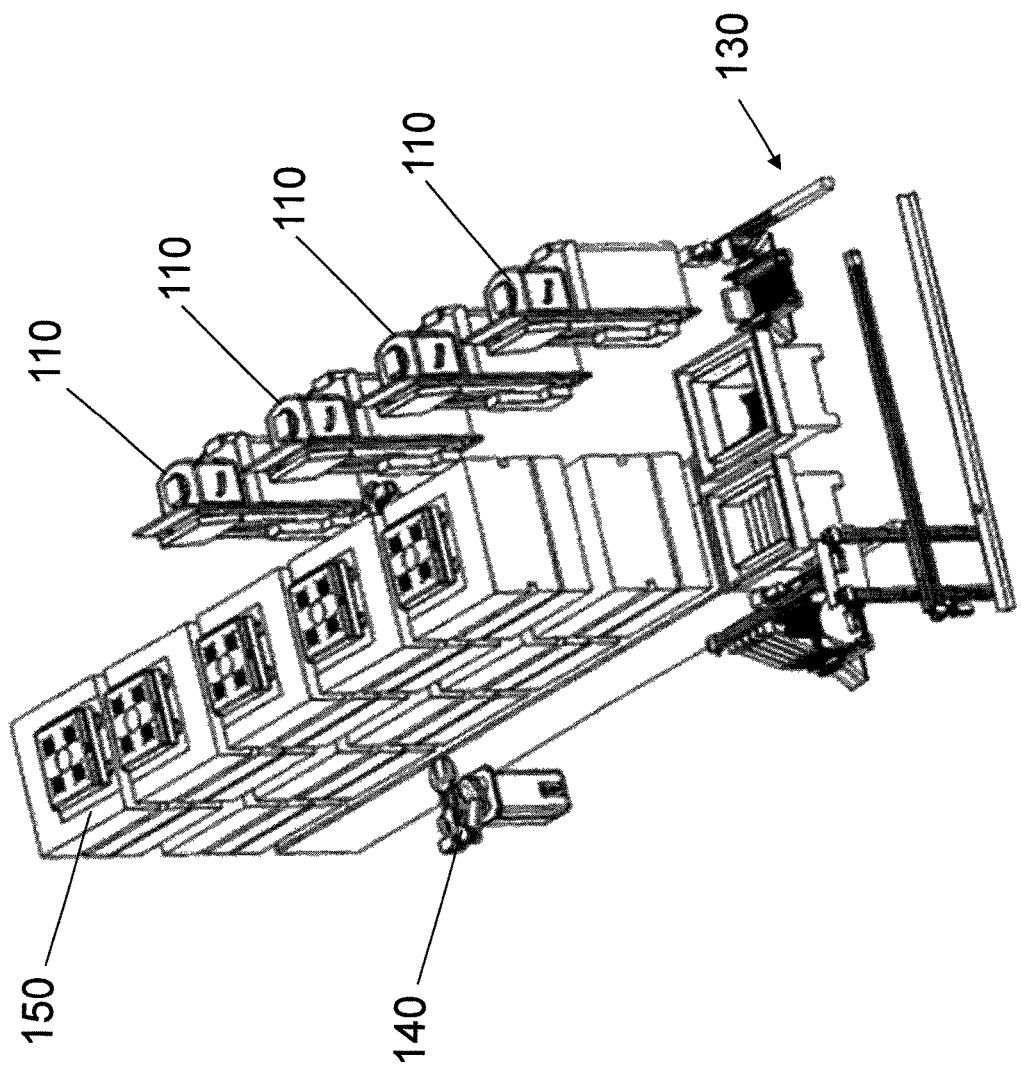
FIG. 15 shows the wafers taken out of the second tank and put in another turnover mechanism.

Referring to FIGS. 10(*a*) to 10(*c*) showing the second tank 138, the second tank 138 is divided into five independent areas. Every area of the second tank 138 has a pair of wafer sustainers 1381 for supporting at most five pieces of wafers. The two wafer sustainers 1381 are connected together by a pair of connecting members 1382 which are disposed at two opposite ends of the wafer sustainers 1381. Two lifting members 1383 are respectively connected to the connecting members 1382 and cylinders 1384. The cylinders 1384 are used for driving the lifting members 1383 to rise or drop, and correspondingly, the wafer sustainers 1381 are lifted or descended along with the lifting members 1383. When the second robot 136 takes five pieces of wafers from the first tank 137 and puts the wafers in the second tank 138, the cylinders 1384 drive the lifting members 1383 to rise and the wafer sustainers 1381 are lifted out of the liquid to receive the wafers, avoiding the second robot 136 contacting the liquid in the second tank 138. After the wafers are put on the wafer sustainers 1381, the cylinders 1384 drive the lifting members 1383 to drop and the wafer sustainers 1381 are descended to make the wafers immerse in the liquid to be processed. The first tank 137 can be as same as the second tank 138.

Figure 20:
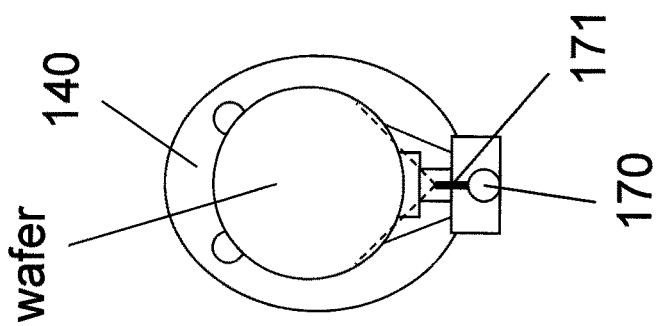
FIG. 20 is a top view showing an exemplary robot of the present invention.

The third robot 140 is equipped with at least one wafer loading arm for taking a piece of wafer from the batch cleaning device 130 every time after the wafer processed in the batch cleaning device 130 and putting the piece of wafer in one of the single wafer cleaning modules 150 to perform single wafer cleaning and drying processes. In order to keep the wafer in wet status all the time before the wafer is put into the single wafer cleaning module 150 to perform the single wafer cleaning and drying processes, a shower head 170 is disposed on the wafer loading arm for spraying deionized water onto the wafer held by the wafer loading arm through a nozzle 171 connecting with the shower head 170, as shown in FIG. 20. Preferably, the third robot 140 can include five independent wafer loading arms and each wafer loading arm is equipped with one end effecter, one shower head 170 and one nozzle 171.

The single wafer cleaning module 150 can be used for cleaning and drying single wafer. For raising the cleaning efficiency, there are several single wafer cleaning modules 150 and the several single wafer cleaning modules 150 have a variety of arrangements. In the preferred embodiment, there are ten single wafer cleaning modules 150 which are arranged in two rows and five columns. It should be recognized that the number of single wafer cleaning modules 150 and the arrangements of the single wafer cleaning modules 150 can be selected flexibly according to the practical applications. Every single wafer cleaning module 150 has a chuck disposed inside a single wafer cleaning chamber. The plurality of wafers are taken from the batch cleaning device 130 in wet status after processed in the batch cleaning device 130 and respectively put on the chuck to be processed. After the wafer is put on the chuck, rotate the chuck and apply chemical solution on the wafer to cleaning the wafer, and then apply deionized water on the wafer. Both the chemical solution and the deionized water are applied on the wafer by using spray nozzles. Then, dry the wafer. Finally, take the dried wafer out of the single wafer cleaning module 150 and put the dried wafer back to the first cassette by using the first robot 120. The chemical solution applied on the wafer can be one kind of the following, such as diluted hydrogen chloride solution, SC1 solution, both the diluted hydrogen chloride solution and SC1 solution, SC2 solution, ozone water solution and functional water doped by gas and $NH_4OH$, wherein, the gas is hydrogen gas with concentration of 1.6 ppm, and concentration of $NH_4OH$ is less than 100 ppm. Preferably, prior to drying the wafer, a kind of chemical solution is applied on the wafer. The kind of chemical solution can be one kind of the following, such as diluted hydrogen chloride solution, SC1 solution and SC2 solution. The method of drying the wafer includes rotating the chuck and applying IPA solution on the wafer. Preferably, apply megasonic wave during single wafer cleaning process.

Figure 6:
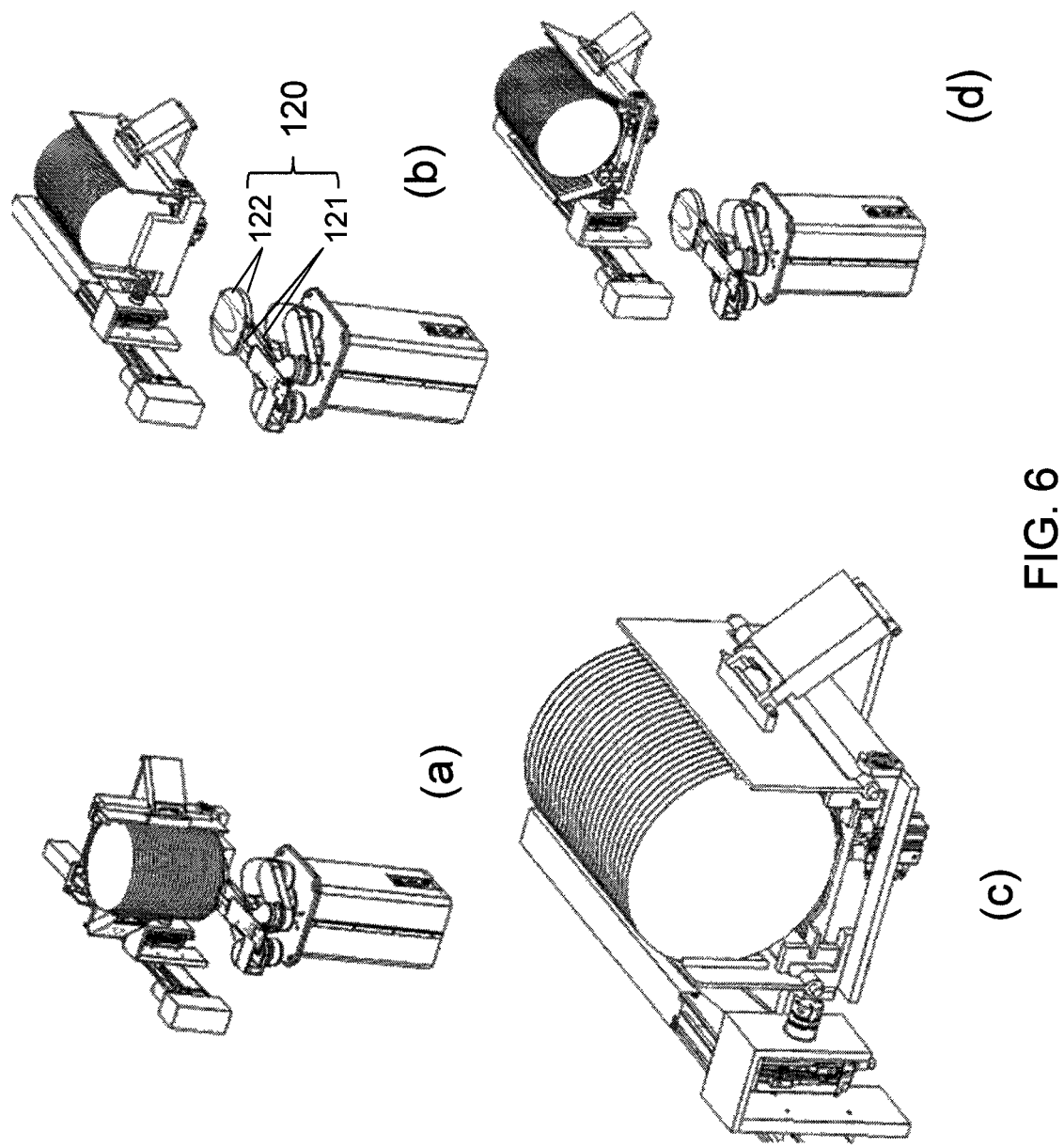
FIGS. 6(a)~(d) show a turnover process of the wafers put in the turnover mechanism.
Figure 7:
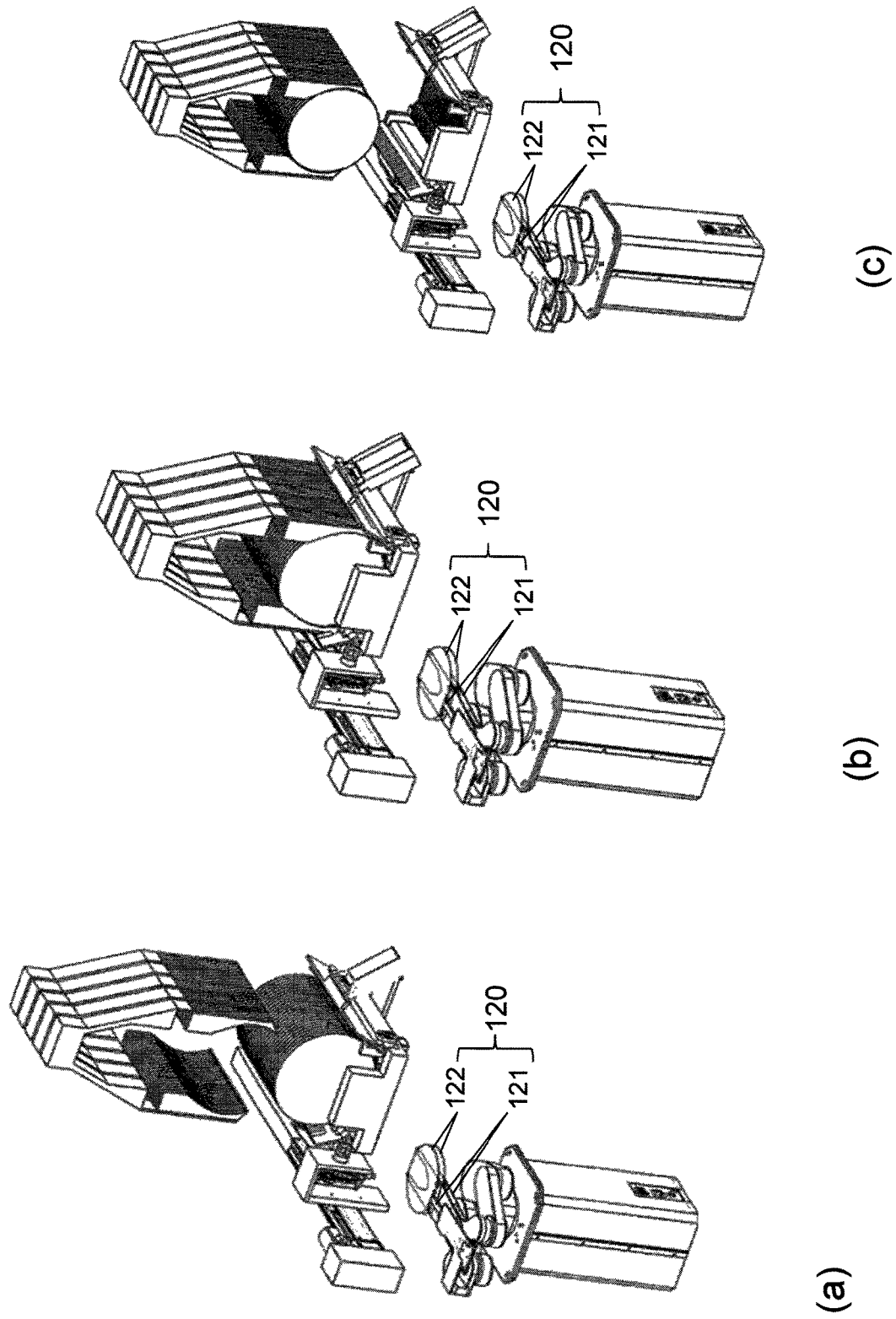
FIGS. 7(a)~(c) show a process of a robot taking the wafers from the turnover mechanism.

Please refer to FIGS. 6(*a*)~(*d*) showing a turnover process of the wafers put in the turnover mechanism 131. The first robot 120 takes about twenty five pieces of wafers from the first cassette located in the load port 110 and puts the wafers in the turnover mechanism 131 adjacent to the first tank 137. Specifically, the wafers are supported by the supporting portions 1314 of the side walls 1313 of the turnover mechanism 131 respectively. The wafers are horizontally disposed between the side walls 1313 and clamped by the side walls 1313. Then the cylinder 1318 connecting with the axle 1319 drives the pedestal 1311 to turn 90° C., so the wafers are vertically arranged in the turnover mechanism 131. The driving device such as a cylinder drives the wafer holder 1316 to slide upwardly along the leading pillars 1312 and the wafers are respectively received in the grooves 1317. Then the two cylinders 1318 which respectively connect with the two side walls 1313 unfold the side walls 1313 so that the second robot 136 can take the wafers from the turnover mechanism 131 for processing, as shown in FIGS. 7(*a*)~(*c*). It should be recognized that the second robot 136 can take twenty five pieces of wafers every time from the turnover mechanism 131 or a multiple of five, such as five, ten, fifteen, twenty, pieces of wafers from the turnover mechanism 131.

Figure 16:
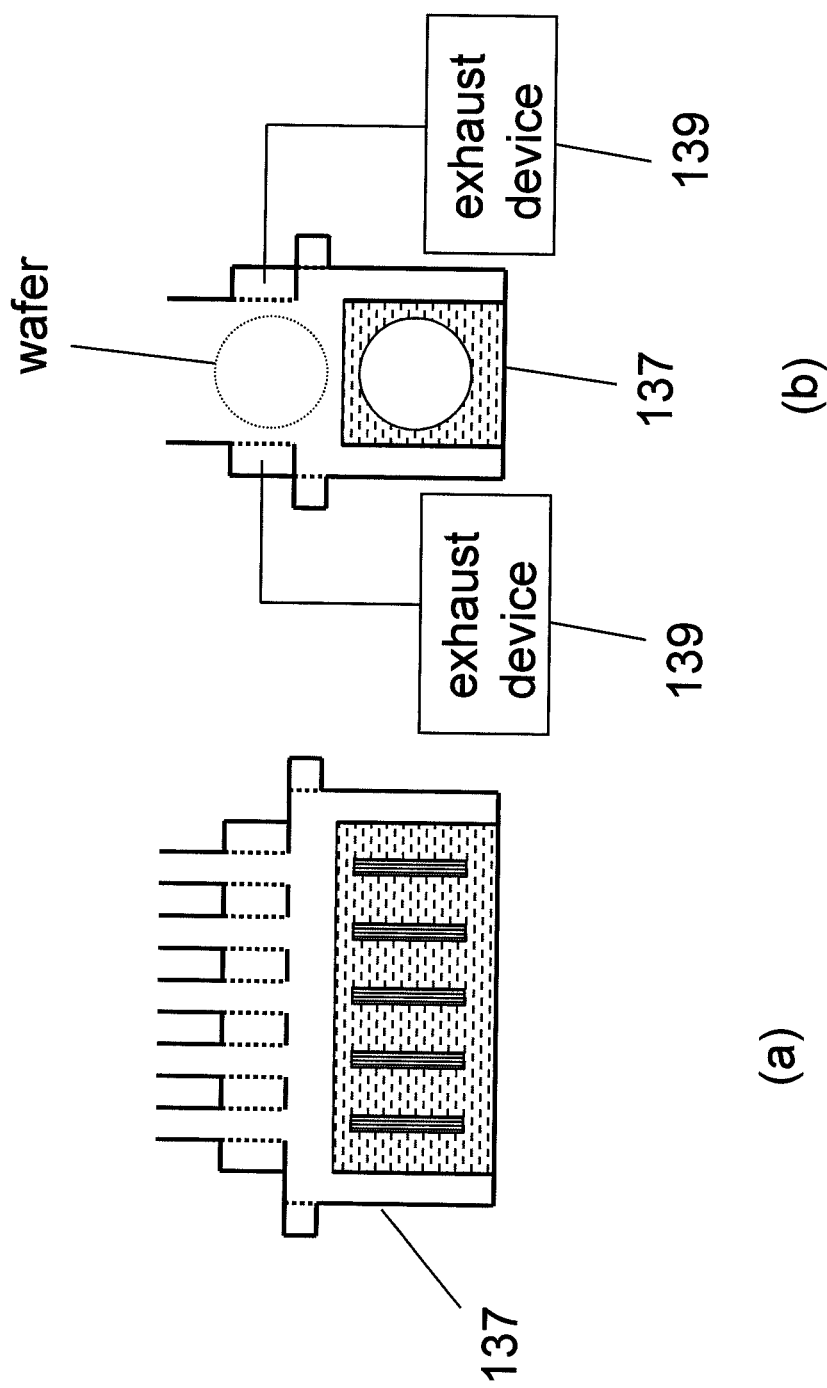
FIG. 16(a) is a front view of the first tank.
FIG. 16(b) is a lateral view of the first tank.

With reference to FIG. 11 to FIG. 15, the second robot 136 takes a plurality of wafers, such as twenty five pieces of wafers from the turnover mechanism 131 and vertically immerses the wafers into the first tank 137 to be cleaned for 30 to 600 seconds. After the wafers are cleaned in the first tank 137, the second robot 136 takes the wafers out of the first tank 137 in wet status and immerses the wafers into the second tank 138 to be cleaned for a period of time. After the wafers are cleaned in the second tank 138, the second robot 136 takes the wafers out of the second tank 138 in wet status and vertically puts the wafers in the turnover mechanism 131 adjacent to the second tank 138. Furthermore, when the wafers are cleaned in the first tank 137, the acid mist produced in the first tank 137 is exhausted by two exhaust devices 139 which are disposed at two sides of the first tank 137, as shown in FIGS. 16(*a*)~(*b*).

Figure 17:
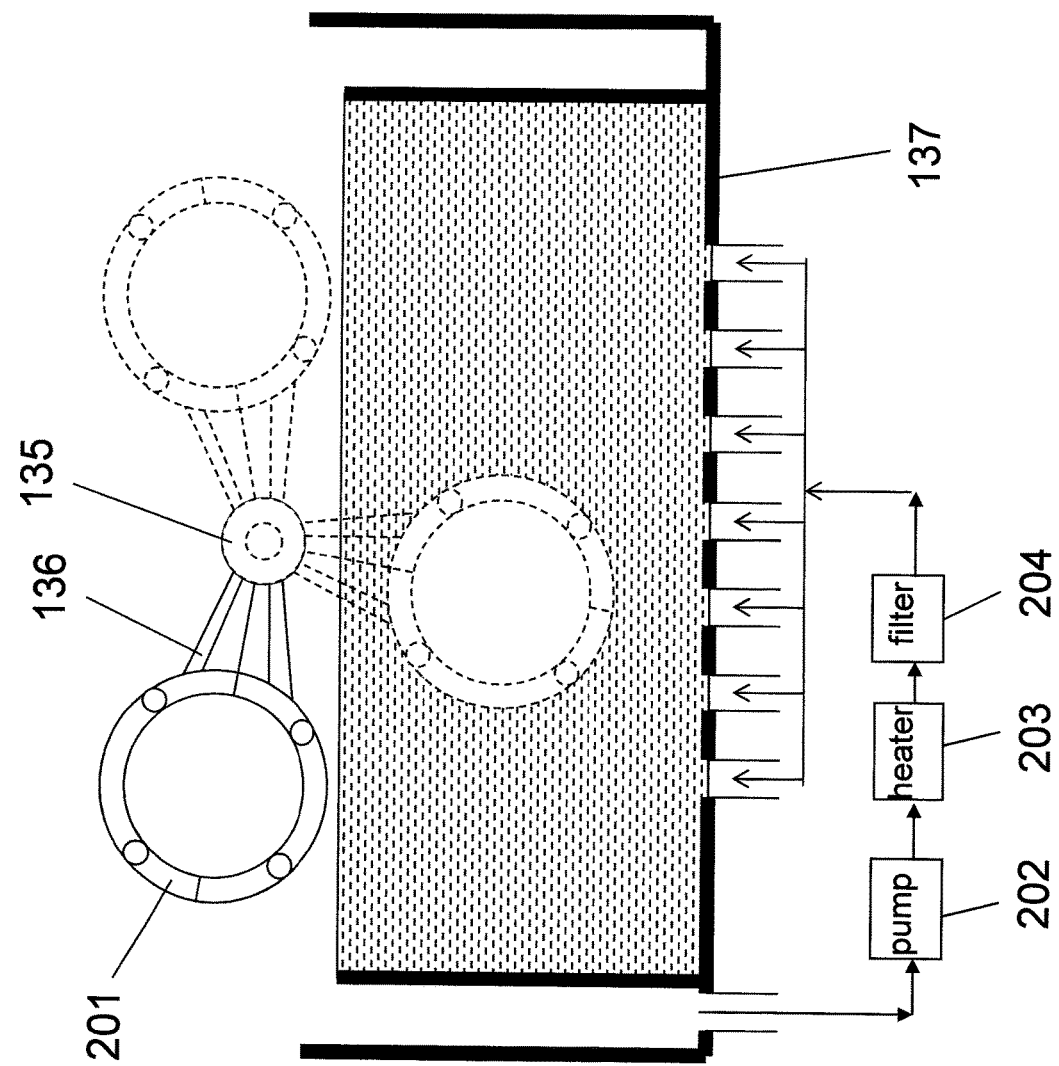
FIG. 17 shows another apparatus for batch cleaning.

With reference to FIG. 17, for ensuring the clean effect, another apparatus for batch cleaning is shown. The apparatus includes a second robot 136 which can swing around a supporting arm 135. The second robot 136 can bring a second cassette 201 loading the wafers therein to swing in the first tank 137 or the second tank 138 for cleaning the wafers. The chemical solution in the first tank 137 can recycle to be used. The chemical solution overflows the first tank 137 and is supplied to the first tank 137 again by a pump 202. Before supplied to the first tank 137, the chemical solution can be heated by a heater 203 and filtered by a filter 204.

Figure 19:
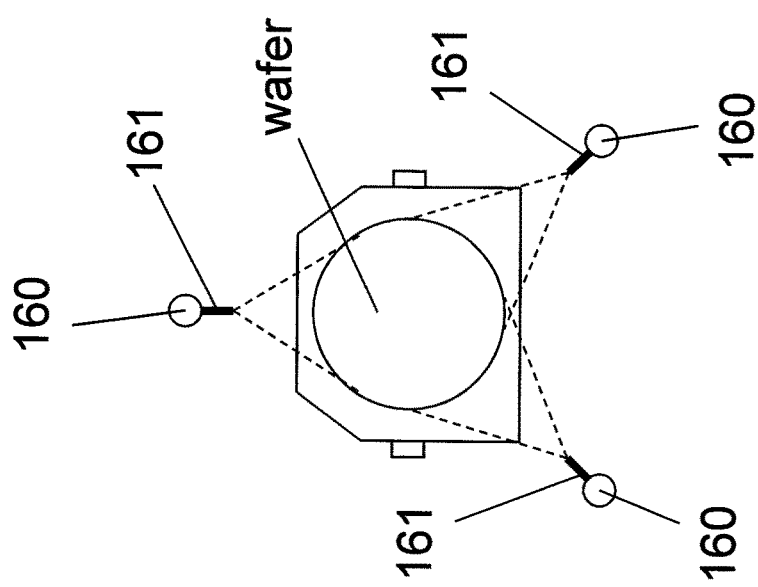
FIG. 19 is a top view showing the apparatus for keeping the wafers in wet status when the wafers are taken out of the second tank.
Figure 18:
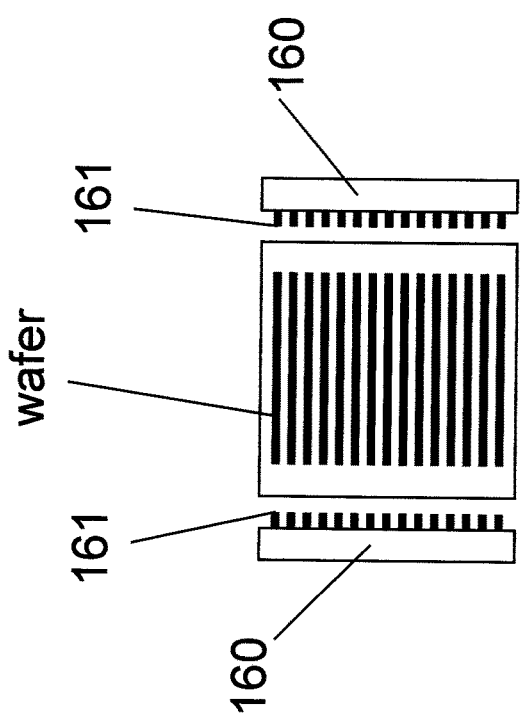
FIG. 18 is a front view showing an apparatus for keeping the wafers in wet status when the wafers are taken out of the second tank.

With reference to FIG. 18 and FIG. 19, after the second robot 136 takes the wafers out of the second tank 138 in wet status, the side walls 1313 of the turnover mechanism 131 adjacent to the second tank 138 are unfolded and the wafer holder 1316 is driven to slide upwardly along the leading pillars 1312, and the second robot 136 puts the wafers in the grooves 1317 vertically. Then the side walls 1313 are folded by the cylinders 1318 and clamp the wafers. The wafer holder 1316 is driven to slide downward along the leading pillars 1312. The cylinder 1318 connecting with the axle 1319 drives the pedestal 1311 to turn 90° C., so the wafers are horizontally arranged in the turnover mechanism 131 and supported by the supporting portions 1314. There are three spray tubes 160 arranged beside the turnover mechanism 131. Every spray tube 160 has about twenty five nozzles 161 for spraying deionized water on the wafers to keep the wafers in wet status all the time before the wafers are put in the single wafer cleaning modules 150 to be processed. Subsequently, the third robot 140 takes the wafers out of the turnover mechanism 131 and puts one piece of wafer in one single wafer cleaning module 150 to be cleaned and dried. After the wafer is processed in the single wafer cleaning module 150, the first robot 120 takes the wafer out of the single wafer cleaning module 150 and puts the wafer back to the first cassette loaded in the load port 110.

Figure 21:
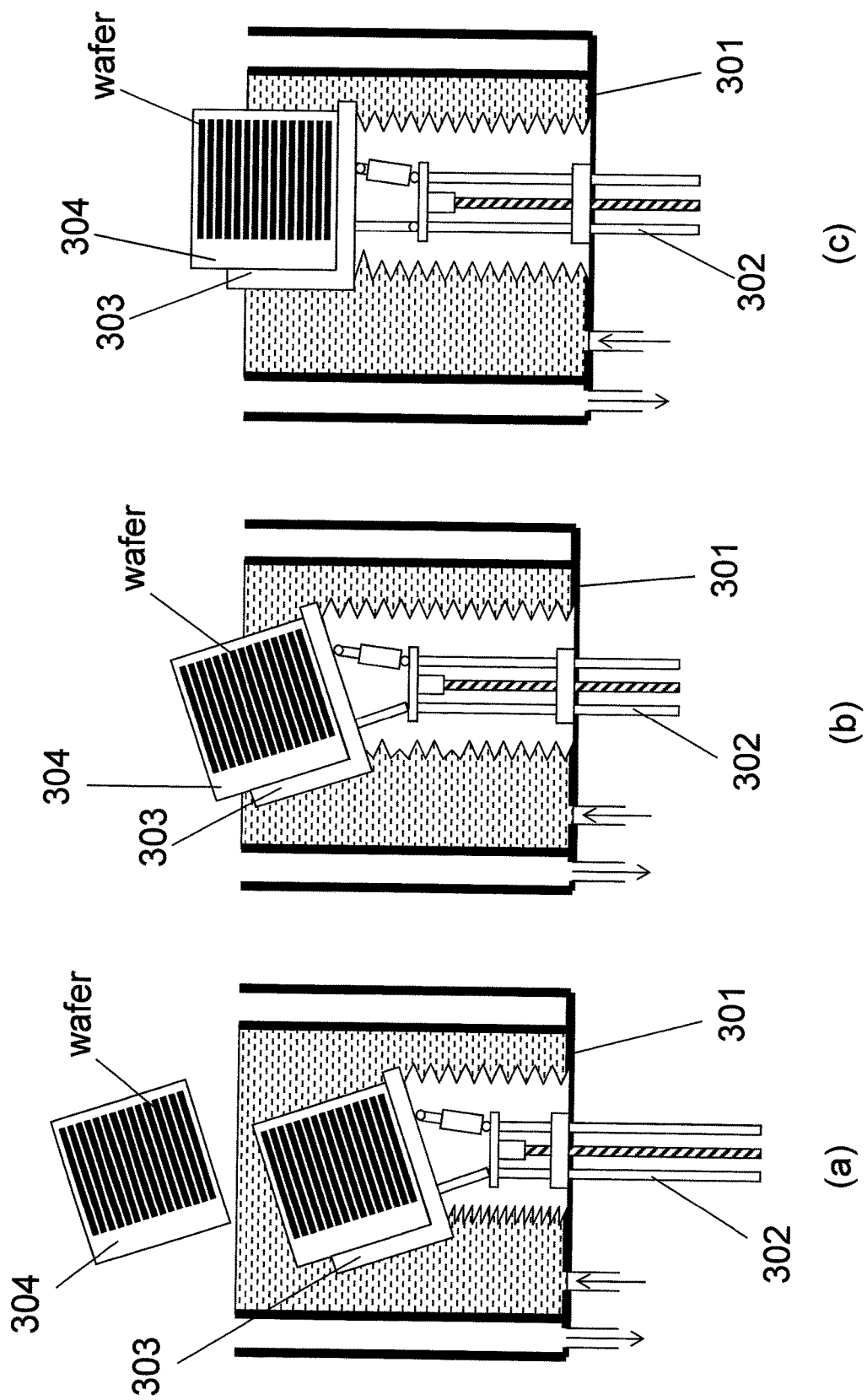
FIGS. 21(a)~(c) show another apparatus for keeping the wafers in wet status when the wafers are taken out of the second tank.

Referring to FIGS. 21(*a*)~(*c*), another apparatus for keeping the wafers in wet status when the wafers are taken out of the second tank 138 is shown. The apparatus includes a trough 301 filled with deionized water. The deionized water in the trough 301 can be drained every time after the same batch of wafers is processed and the fresh deionized water is supplied to the trough 301 to process the next batch of wafers. A lifting apparatus 302 is disposed in the trough 301 and a frame 303 is aslant fixed on the lifting apparatus 302 for holding a third cassette 304 which receives the wafers therein. The third cassette 304 with the wafers is aslant put in the frame 303 and immersed in the deionized water in the trough 301. When the wafers need to be taken out of the third cassette 304, the lifting apparatus 302 raises the frame 303 and makes the frame 303 on the lifting apparatus 302 upright expose outside. The third cassette 304 is upright in the frame 303 so the wafers are disposed in the third cassette 304 horizontally. Then the wafers are taken out of the third cassette 304 by the third robot 140 and put in the single wafer cleaning modules 150 to be cleaned and dried. It should be recognized that before the wafers are put in the single wafer cleaning modules 150 to be cleaned and dried, the wafers are keeping in wet status all the time.

Figure 22:
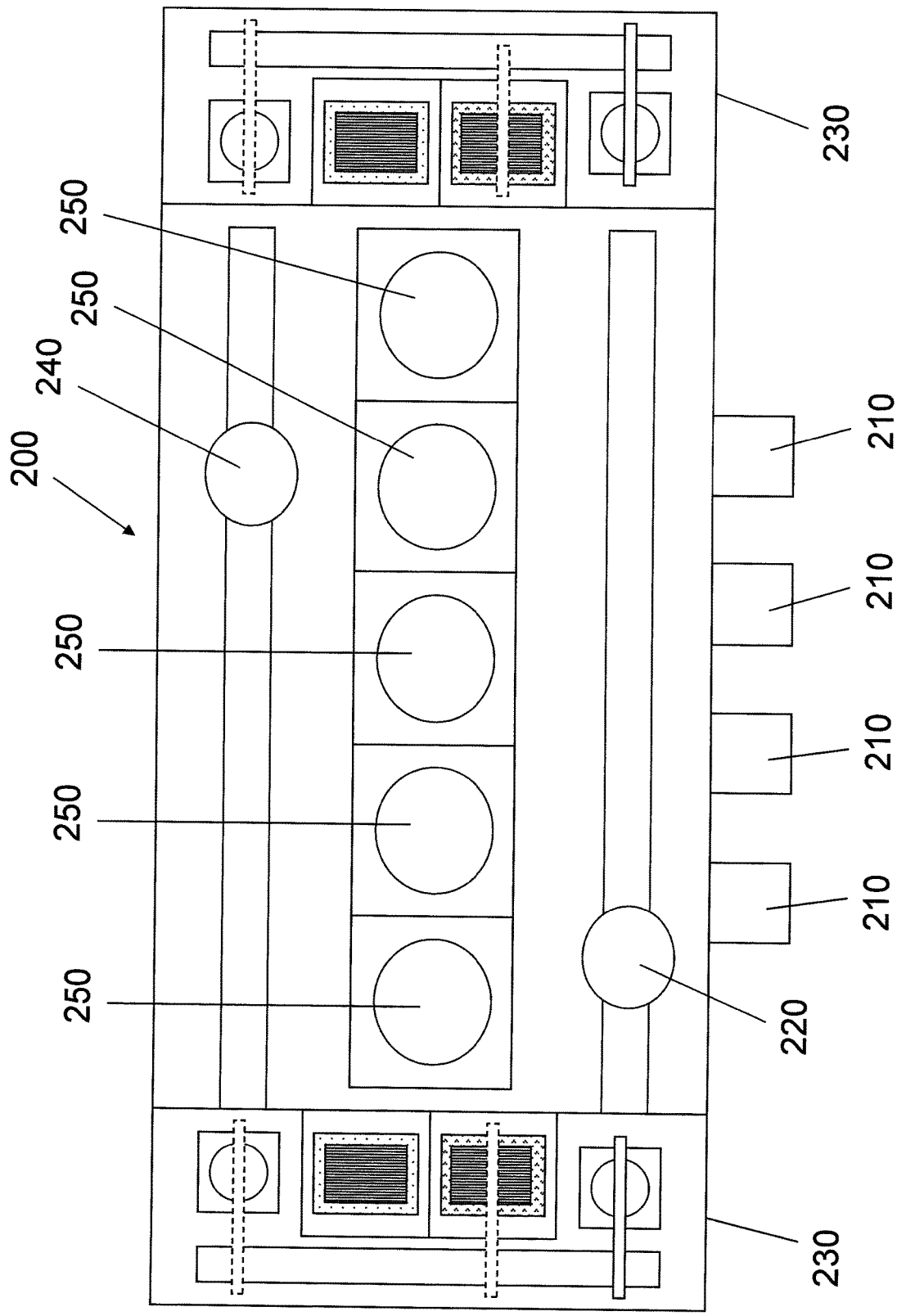
FIG. 22 is a schematic view showing another exemplary apparatus for cleaning semiconductor wafer of the present invention.

Please refer to FIG. 22 showing another exemplary apparatus 200 for cleaning semiconductor wafer of the present invention. The apparatus 200 includes several load ports 210, a first robot 220, two batch cleaning devices 230, a third robot 240 and several single wafer cleaning modules 250. Comparing to the apparatus 100, the difference is that the apparatus 200 has two batch cleaning devices 230 disposed at two opposite ends of the apparatus 200. The apparatus 200 can raise the cleaning efficiency.

Figure 23:
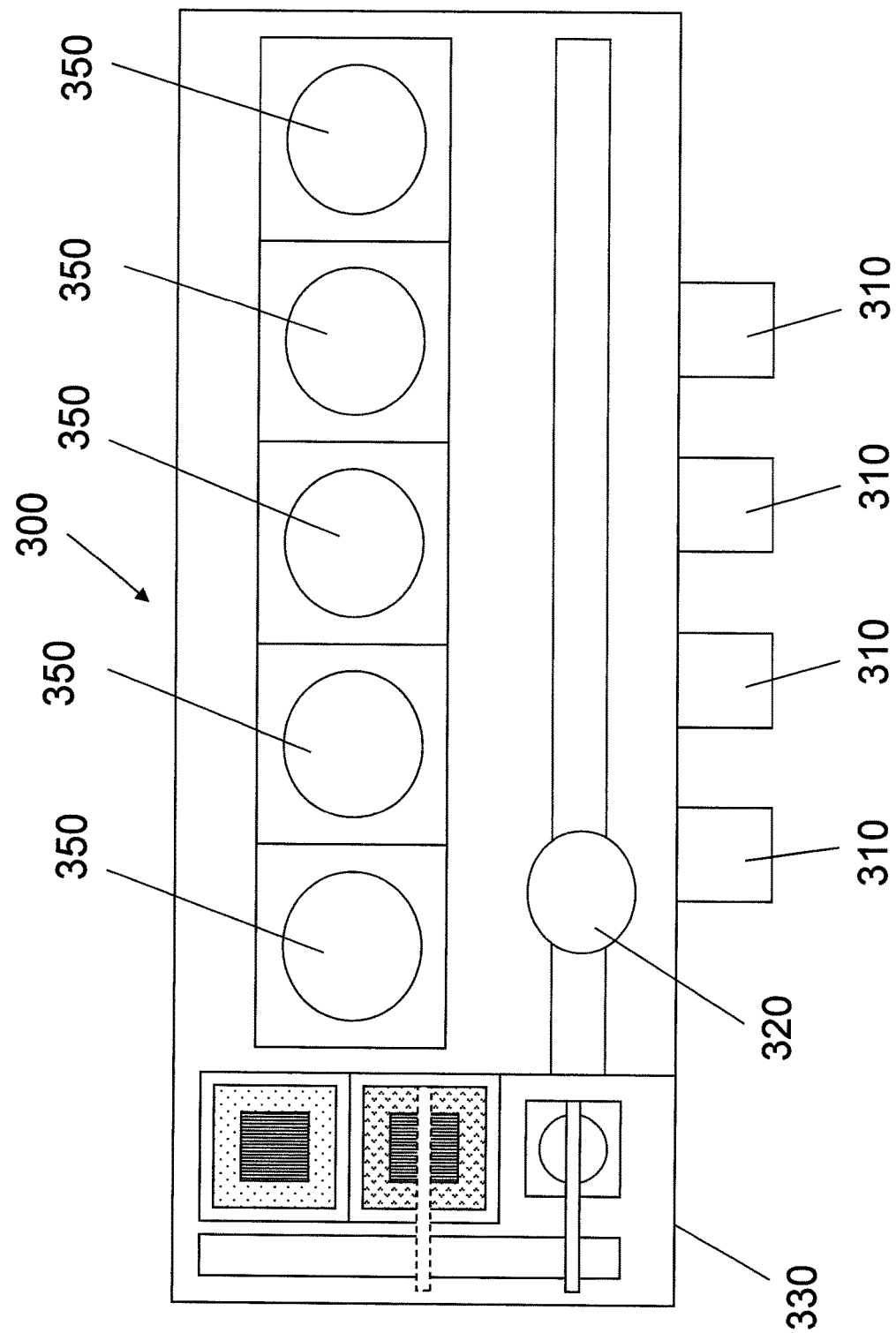
FIG. 23 is a schematic view showing another exemplary apparatus for cleaning semiconductor wafer of the present invention.

Please refer to FIG. 23 showing another exemplary apparatus 300 for cleaning semiconductor wafer of the present invention. The apparatus 300 includes several load ports 310, a first robot 320, a batch cleaning device 330, and several single wafer cleaning modules 350. Comparing to the apparatus 100, the difference is that the apparatus 300 is lack of a third robot. The first robot 320 can transfer the wafers among the load ports 310, the batch cleaning device 330 and the single wafer cleaning modules 350. Therefore, the first robot 320 can be equipped with at least three wafer loading arms. One of the wafer loading arms is used for taking wafers from the load ports 310 and putting the wafers in the batch cleaning device 330 to be processed. One of the wafer loading arms is used for taking the wafers out of the batch cleaning device 330 and putting one of the wafers into one of the single wafer cleaning modules 350 for performing single wafer cleaning and drying processes. One of the wafer loading arms is used for taking the wafer out of the single wafer cleaning module 350 and putting the wafer back to the load port 310.

Figure 24:
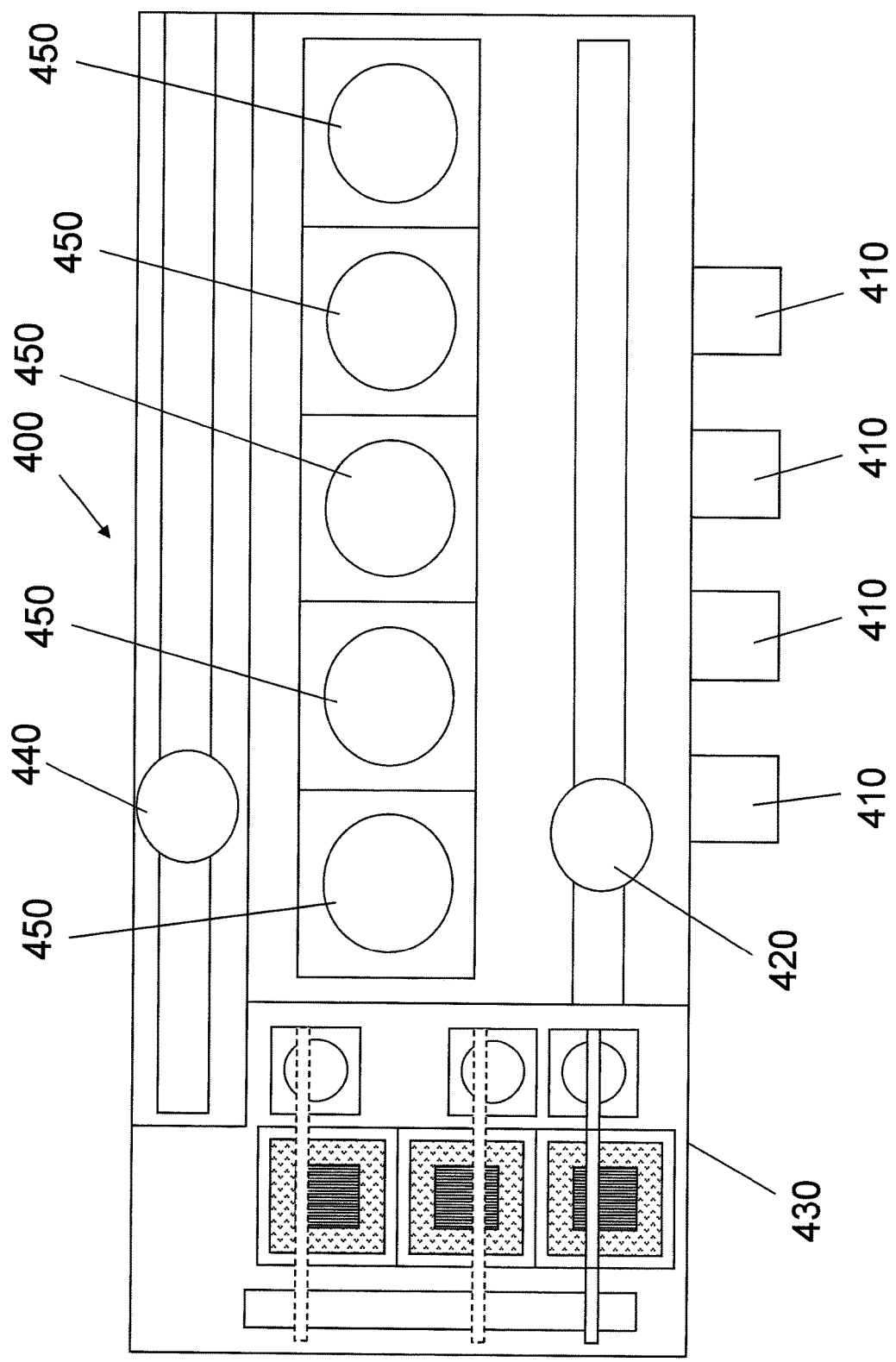
FIG. 24 is a schematic view showing another exemplary apparatus for cleaning semiconductor wafer of the present invention.

Please refer to FIG. 24 showing another exemplary apparatus 400 for cleaning semiconductor wafer of the present invention. The apparatus 400 includes several load ports 410, a first robot 420, a batch cleaning device 430, a third robot 440 and several single wafer cleaning modules 450. Comparing to the apparatus 100, the difference is that the batch cleaning device 430 of the apparatus 400 has more than one first tank for processing wafers. For example, there are two first tanks in the embodiment and the two first tanks are filled with the same chemical solution. The two first tanks and a second tank of the batch cleaning device 430 are disposed side by side. The wafers from the load ports 410 are put in one of the first tanks for roughly cleaning and then put in the other first tank for meticulously cleaning. After the wafers are cleaned in the first tanks, the wafers are put in the second tank for cleaning.

Figure 25:
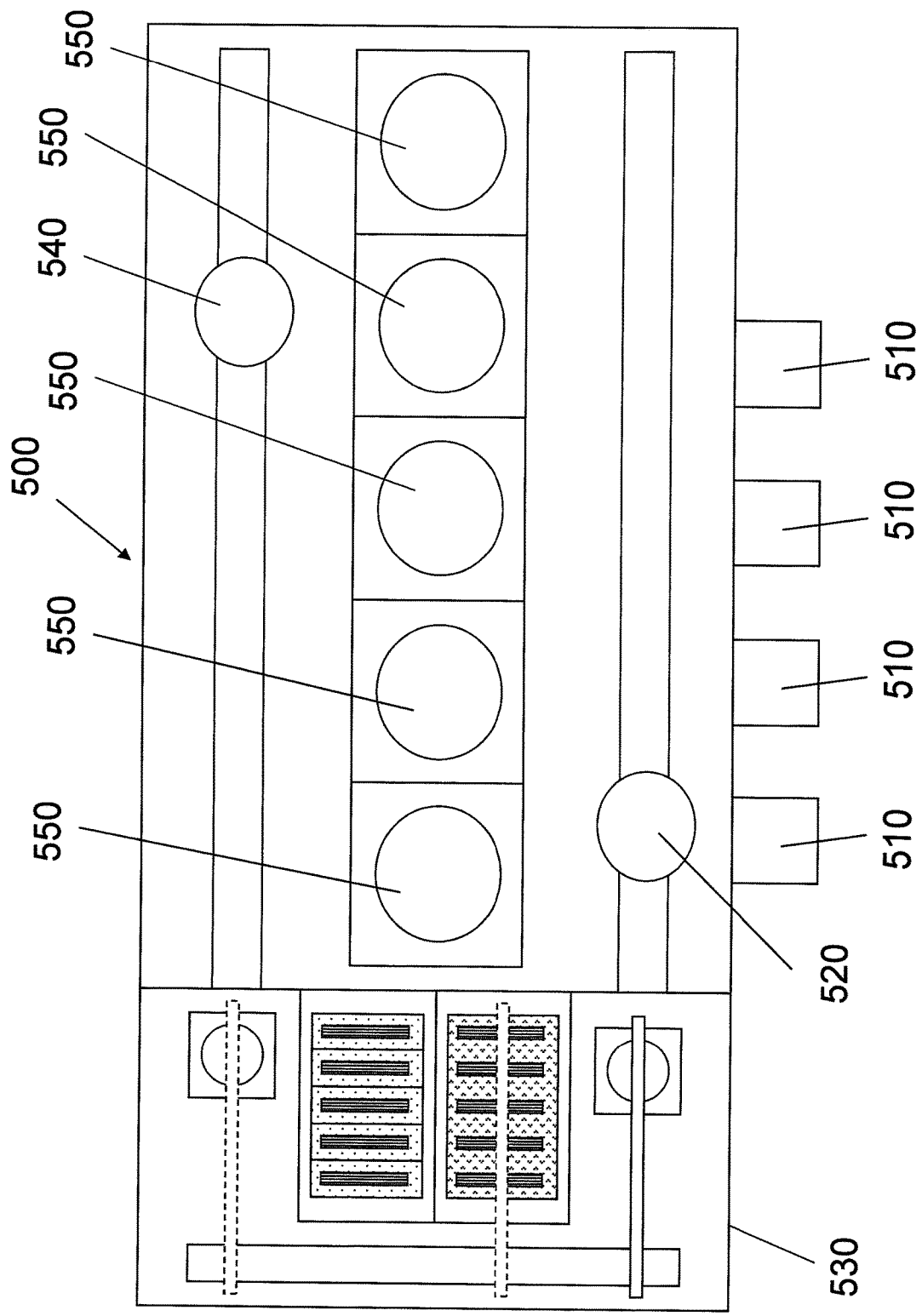
FIG. 25 is a schematic view showing another exemplary apparatus for cleaning semiconductor wafer of the present invention.

Please refer to FIG. 25 showing another exemplary apparatus 500 for cleaning semiconductor wafer of the present invention. The apparatus 500 includes several load ports 510, a first robot 520, a batch cleaning device 530, a third robot 540 and several single wafer cleaning modules 550. Comparing to the apparatus 100, the difference is that a first tank and a second tank of the apparatus 500 are divided into five independent areas. Every area can process five pieces of wafers every time.

Figure 26:
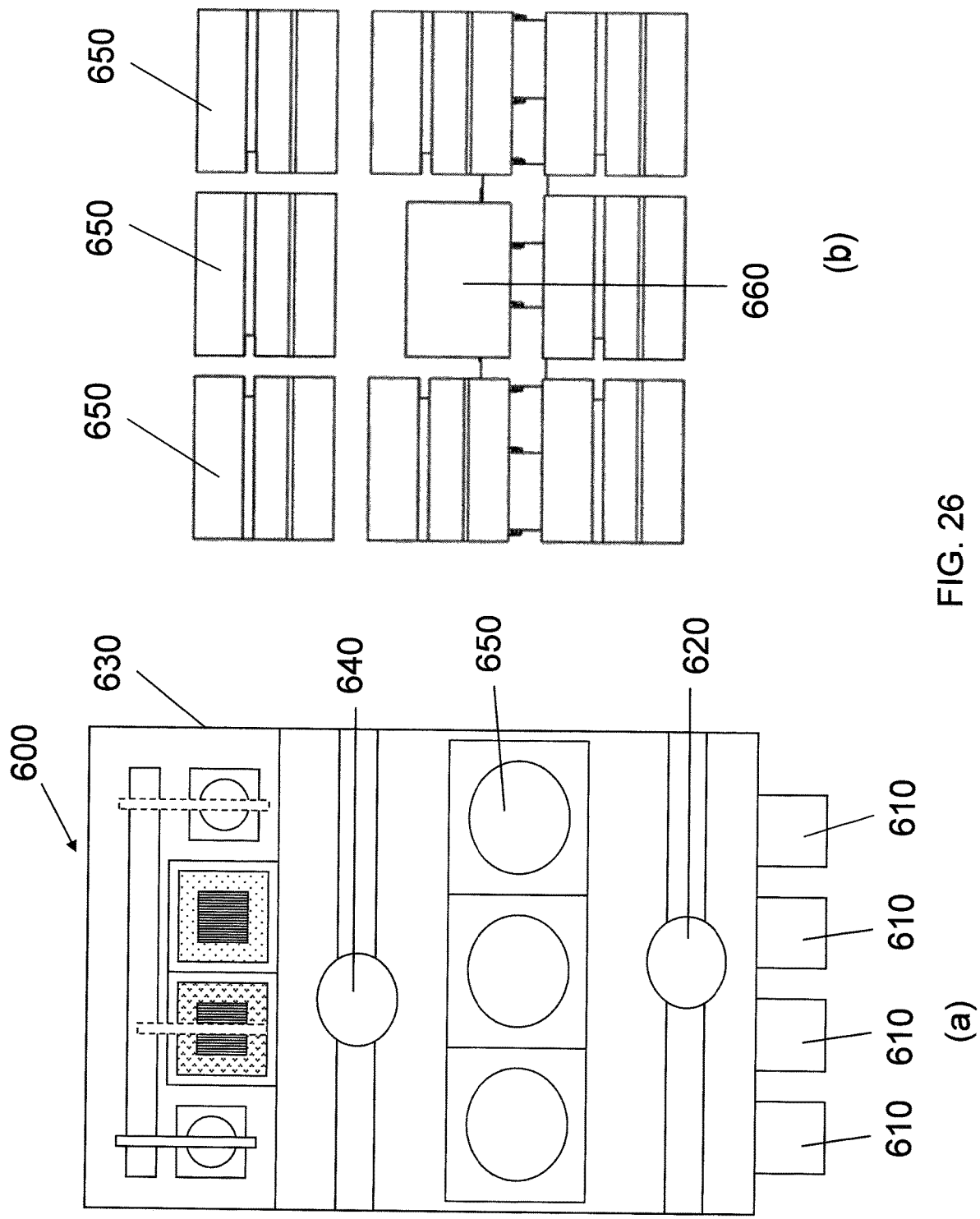
FIG. 26(a) is a schematic view showing another exemplary apparatus for cleaning semiconductor wafer of the present invention.
FIG. 26(b) is a front view showing an exemplary arrangement of single wafer cleaning modules of the present invention.

Please refer to FIG. 26(*a*) showing another exemplary apparatus 600 for cleaning semiconductor wafer of the present invention. The apparatus 600 includes several load ports 610, a first robot 620, a batch cleaning device 630, a third robot 640 and several single wafer cleaning modules 650. Comparing to the apparatus 100, the difference is that the apparatus 600 further includes a buffer area 660, as shown in FIG. 26(*b*). The apparatus 600 can include eight single wafer cleaning modules 650 and one buffer area 660 which are arranged in three rows and three columns, and thereinto, the buffer area 660 is disposed at the center portion. It should be recognized that the number of single wafer cleaning modules 650 of the apparatus 600 is flexible and not limited in eight, and meanwhile the buffer area 660 can be disposed at any suitable portion. The first robot 620 takes a plurality of wafers from the load ports 610 and puts the wafers into the buffer area 660. The third robot 640 takes the wafers from the buffer area 660 and transfers the wafers to the batch cleaning device 630 to be processed. After the wafers processed in the batch cleaning device 630, the third robot 640 takes the wafers out of the batch cleaning device 630 and puts one piece of wafer in one single wafer cleaning module 650 to be processed. After the wafer processed in the single wafer cleaning module 650, the first robot 620 takes the wafer out of the single wafer cleaning module 650 and puts the wafer back to a first cassette of the load port 610.

Accordingly, a method for cleaning semiconductor wafer of the present invention is summarized as below:

In step 1: taking at least two wafers from the first cassette in the load port 110 and putting the wafers into the first tank 137 filled with chemical solution;

In step 2: after the wafers have been processed in the first tank 137, taking the wafers in wet status out of the first tank 137 and putting the wafers into the second tank 138 filled with liquid;

In step 3: after the wafers have been processed in the second tank 138, taking the wafers in wet status out of the second tank 138 and putting one of the wafers on the chuck inside one single wafer cleaning module 150;

In step 4: rotating the chuck while applying chemical solution on the wafer;

In step 5: applying deionized water on the wafer;

In step 6: drying the wafer; and

In step 7: taking the wafer out of the single wafer cleaning module 150 and then putting the wafer back to the first cassette in the load port 110.

As described above, the present invention combines the batch cleaning and the single wafer cleaning together, developing the advantages of the batch cleaning and the single wafer cleaning for cleaning the wafers. The apparatus and method can effectively remove organics, particles and film material after a dry etching process. The high temperature process can be performed in the batch cleaning device 130 to remove the organics since the high temperature chemical solution can be recycled in the batch cleaning device 130 and the acid mist produced during the batch cleaning process can be controlled well. The particles and film material are removed in the single wafer cleaning modules 150. Besides, the wafers are kept in wet status all the time before the wafers are put in the single wafer cleaning modules 150 to be cleaned and dried, making the contaminants adhered on the wafers being removed easily.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A method for cleaning semiconductor wafers, comprising:

taking at least two wafers from a cassette in a load port and putting said wafers into a first tank filled with chemical solution;

after said wafers have been processed in the first tank, taking said wafers out of the first tank in wet status;

putting said wafers in wet status into a second tank filled with liquid;

after said wafers have been processed in the second tank, taking said wafers out of the second tank and keeping said wafers in wet status;

putting one of said wafers on a chuck inside a single wafer cleaning module;

rotating the chuck while applying chemical solution on said wafer;

applying deionized water on said wafer;

drying said wafer; and taking said wafer out of the single wafer cleaning module and then putting said wafer back to the cassette in the load port.

2. The method as claimed in claim 1, wherein the chemical solution in the first tank is hot SPM at an elevated temperature higher than 20° C. and lower than 250° C.

3. The method as claimed in claim 1, wherein the chemical solution in the first tank includes a solvent, temperature of which is an elevated temperature higher than 20° C. and lower than 250° C.

4. The method as claimed in claim 3, wherein the solvent in the first tank is TMAH.

5. The method as claimed in claim 1, wherein the liquid in the second tank is deionized water.

6. The method as claimed in claim 5, wherein the deionized water in the second tank is heated to an elevated temperature higher than 20° C. and lower than 100° C.

7. The method as claimed in claim 1, wherein the step of rotating the chuck while applying chemical solution on said wafer includes applying diluted hydrogen chloride, SC1, SC2 or ozone solution on said wafer.

8. The method as claimed in claim 1, wherein the step of rotating the chuck while applying chemical solution on said wafer includes applying functional water doped by gas and NH4OH on said wafer.

9. The method as claimed in claim 8, wherein the gas is hydrogen gas with concentration of 1.6 ppm, and concentration of $NH_4OH$ is less than 100 ppm.

10. The method as claimed in claim 1, further comprising applying chemical solution on said wafer prior to the step of drying said wafer.

11. The method as claimed in claim 10, wherein the chemical solution is diluted hydrogen chloride, SC1, or SC2 solution.

12. The method as claimed in claim 1, wherein the step of drying said wafer includes rotating the chuck while applying IPA solution on said wafer to dry said wafer.

13. The method as claimed in claim 1, further comprising applying megasonic wave to clean said wafer in the single wafer cleaning module.

14. The method as claimed in claim 1, wherein applying chemical solution and deionized water on said wafer by using a spray nozzle.

* * * * *